US009136362B2

(12) United States Patent
Sakai et al.

(10) Patent No.: US 9,136,362 B2
(45) Date of Patent: Sep. 15, 2015

(54) SEMICONDUCTOR DEVICE HAVING LATERAL ELEMENT

(75) Inventors: Takeshi Sakai, Nagoya (JP); Akira Yamada, Nukata-gun (JP); Shigeki Takahashi, Okazaki (JP); Youichi Ashida, Nukata-gun (JP); Satoshi Shiraki, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 272 days.

(21) Appl. No.: 13/615,912

(22) Filed: Sep. 14, 2012

(65) Prior Publication Data

US 2013/0075877 A1     Mar. 28, 2013

(30) Foreign Application Priority Data

Sep. 27, 2011  (JP) ................................. 2011-210675
Jul. 10, 2012   (JP) ................................. 2012-154884

(51) Int. Cl.
*H01L 29/02*    (2006.01)
*H01L 29/739*   (2006.01)
*H01L 21/765*   (2006.01)
*H01L 29/40*    (2006.01)
(Continued)

(52) U.S. Cl.
CPC .......... *H01L 29/7394* (2013.01); *H01L 21/765* (2013.01); *H01L 29/0696* (2013.01); *H01L 29/0834* (2013.01); *H01L 29/404* (2013.01); *H01L 29/405* (2013.01); *H01L 29/41725* (2013.01); *H01L 29/868* (2013.01); *H01L 29/8611* (2013.01)

(58) Field of Classification Search
CPC ... H01L 21/765; H01L 29/404; H01L 29/405; H01L 29/41725; H01L 29/8611; H01L 29/0696; H01L 2924/1305; H01L 29/0834

USPC .......... 257/655, 367, 409, E29.012, E29.013, 257/577, 77, 488, 489, 140, 133, 110, 257/E29.197, E29.066, E29.027, E29.009
See application file for complete search history.

(56) References Cited

U.S. PATENT DOCUMENTS

| 5,315,139 A | 5/1994 | Endo |
| 5,343,067 A * | 8/1994 | Nakagawa et al. ........... 257/487 |

(Continued)

FOREIGN PATENT DOCUMENTS

| JP | H04-332173 A | 11/1992 |
| JP | H06-318714 A | 11/1994 |
| JP | 2003-086701 A | 3/2003 |

OTHER PUBLICATIONS

Office action mailed Oct. 31, 2014 in the corresponding CN application No. 201210369374.1 (and English translation).

(Continued)

*Primary Examiner* — Yosef Gebreyesus
(74) *Attorney, Agent, or Firm* — Posz Law Group, PLC

(57) ABSTRACT

A semiconductor device with a lateral element includes a semiconductor substrate, first and second electrodes on the substrate, and a resistive field plate extending from the first electrode to the second electrode. The lateral element passes a current between the first and second electrodes. A voltage applied to the second electrode is less than a voltage applied to the first electrode. The resistive field plate has a first end portion and a second end portion opposite to the first end portion. The second end portion is located closer to the second electrode than the first end portion. An impurity concentration in the second end portion is equal to or greater than $1 \times 10^{18}$ $cm^{-3}$.

3 Claims, 28 Drawing Sheets

(51) Int. Cl.
*H01L 29/417* (2006.01)
*H01L 29/861* (2006.01)
*H01L 29/868* (2006.01)
*H01L 29/06* (2006.01)
*H01L 29/08* (2006.01)

(56) References Cited

U.S. PATENT DOCUMENTS

| | | | | |
|---|---|---|---|---|
| 5,382,825 | A | * | 1/1995 | Neilson .......................... 257/489 |
| 5,438,220 | A | * | 8/1995 | Nakagawa et al. ........... 257/487 |
| 5,985,708 | A | * | 11/1999 | Nakagawa et al. ........... 438/206 |
| 6,177,713 | B1 | * | 1/2001 | Aono et al. .................... 257/490 |
| 6,525,390 | B2 | * | 2/2003 | Tada et al. ..................... 257/489 |
| 6,608,351 | B1 | * | 8/2003 | Meeuwsen et al. ........... 257/343 |
| 2001/0048122 | A1 | * | 12/2001 | Tada et al. ..................... 257/240 |
| 2005/0274985 | A1 | * | 12/2005 | Adlerstein .................... 257/213 |
| 2012/0061726 | A1 | | 3/2012 | Tokura et al. |
| 2012/0119318 | A1 | * | 5/2012 | Tokura et al. ................. 257/489 |
| 2013/0032895 | A1 | * | 2/2013 | Disney et al. ................. 257/409 |
| 2013/0043532 | A1 | * | 2/2013 | Disney et al. ................. 257/335 |

OTHER PUBLICATIONS

Office action mailed Feb. 4, 2014 in the corresponding JP application No. 2012-154884 (and English translation).

* cited by examiner

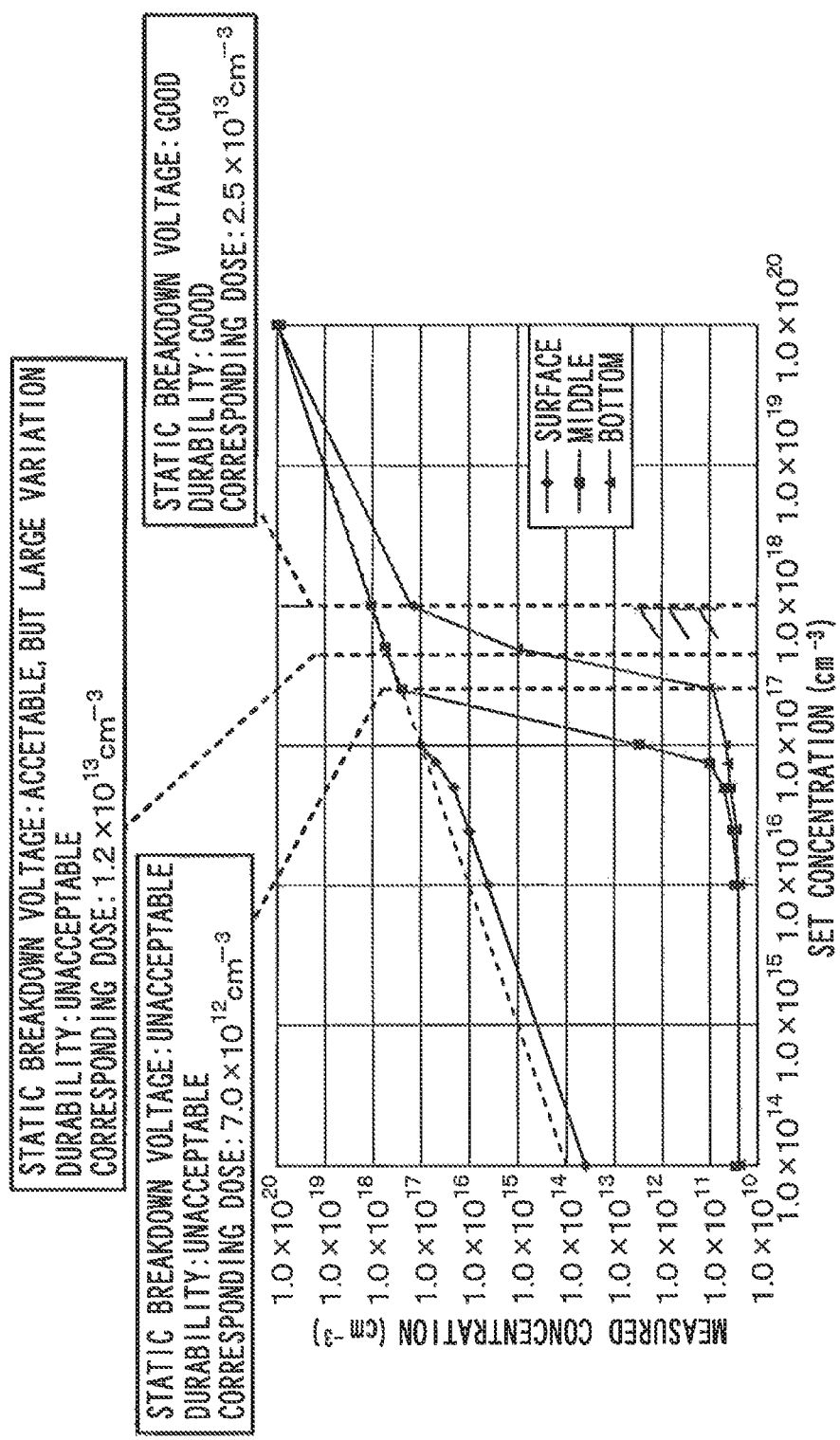

SET CONCENTRATION $1\times10^{14} cm^{-3}$

SET CONCENTRATION $1\times10^{17} cm^{-3}$

SET CONCENTRATION $1\times10^{20} cm^{-3}$

US 9,136,362 B2

SEMICONDUCTOR DEVICE HAVING LATERAL ELEMENT

CROSS REFERENCE TO RELATED APPLICATION

This application is based on Japanese Patent Application No. 2011-210675 filed on Sep. 27, 2011 and 2012-154884 filed on Jul. 10, 2012, the disclosures of which are incorporated herein by reference.

TECHNICAL FIELD

The present disclosure relates generally to semiconductor devices having a lateral element such as a lateral diode or a lateral insulated gate bipolar transistor (IGBT), and relates in particular to a semiconductor device having such a lateral element formed in a silicon-on-insulator (SOI) substrate.

BACKGROUND

U.S. Pat. No. 5,315,139 corresponding to JP 3207615 discloses a scroll-shaped field plate (SRFP) for reducing an electric field in a lateral high-voltage lateral power element. The SRFP is used for a high-voltage lateral diode, a high-voltage lateral IGBT, and a high-voltage lateral MOSFET. The SRFP allows such an element to have a desired breakdown voltage for direct current and low speed switching application.

U.S. Pat. No. 5,315,139 is silent on a resistance of the SRFP. The present inventors deeply studied a relationship between the resistance of the SRFP and the breakdown voltage and found that the breakdown voltage can vary depending on the concentration of an impurity in the SRFP and the resistance of the SRFP.

SUMMARY

In view of the above, it is an object of the present disclosure to provide a semiconductor device having a lateral element and configured to reduce a variation in a breakdown voltage of the lateral element.

According to an aspect of the present disclosure, a semiconductor device with a lateral element includes a semiconductor substrate, a first electrode, a second electrode, and a resistive field plate. The semiconductor substrate includes a first conductivity-type semiconductor layer. The first electrode is located on a surface of the semiconductor layer. The second electrode is located on the surface of the semiconductor layer. The resistive field plate extends from the first electrode toward the second electrode. The lateral element passes an electric current between the first electrode and the second electrode. A voltage applied to the second electrode is less than a voltage applied to the first electrode. The resistive field plate has a first end portion and a second end portion opposite to the first end portion. The second end portion of the resistive field plate is located closer to the second electrode than the first end portion of the resistive field plate. A concentration of an impurity in the second end portion is equal to or greater than $1\times10^{18}$ cm$^{-3}$.

According to another aspect of the present disclosure, a semiconductor device with a lateral element includes a semiconductor substrate, a first electrode, a second electrode, and a resistive field plate. The semiconductor substrate includes a first conductivity-type semiconductor layer. The first electrode is located on a surface of the semiconductor layer. The second electrode is located on the surface of the semiconductor layer. The resistive field plate is wound in a scroll shape around the first electrode and extends toward the second electrode. A resistance of the resistive field plate is equal to or less than $1\times10^6$ Ω/sq.

BRIEF DESCRIPTION OF THE DRAWINGS

The above and other objects, features and advantages of the present disclosure will become more apparent from the following detailed description made with reference to the accompanying drawings. In the drawings:

FIG. 6C is a diagram illustrating a relationship between a set impurity concentration and a measured impurity concentration of each of a surface part, a middle part, and a bottom part of the emitter-side end portion of the SRFP;

DETAILED DESCRIPTION

First Embodiment

A semiconductor device, having a lateral element according to a first embodiment of the present disclosure is described below. As an example of applications of the semiconductor device, an inverter for a three-phase motor is described.

Figure 1:
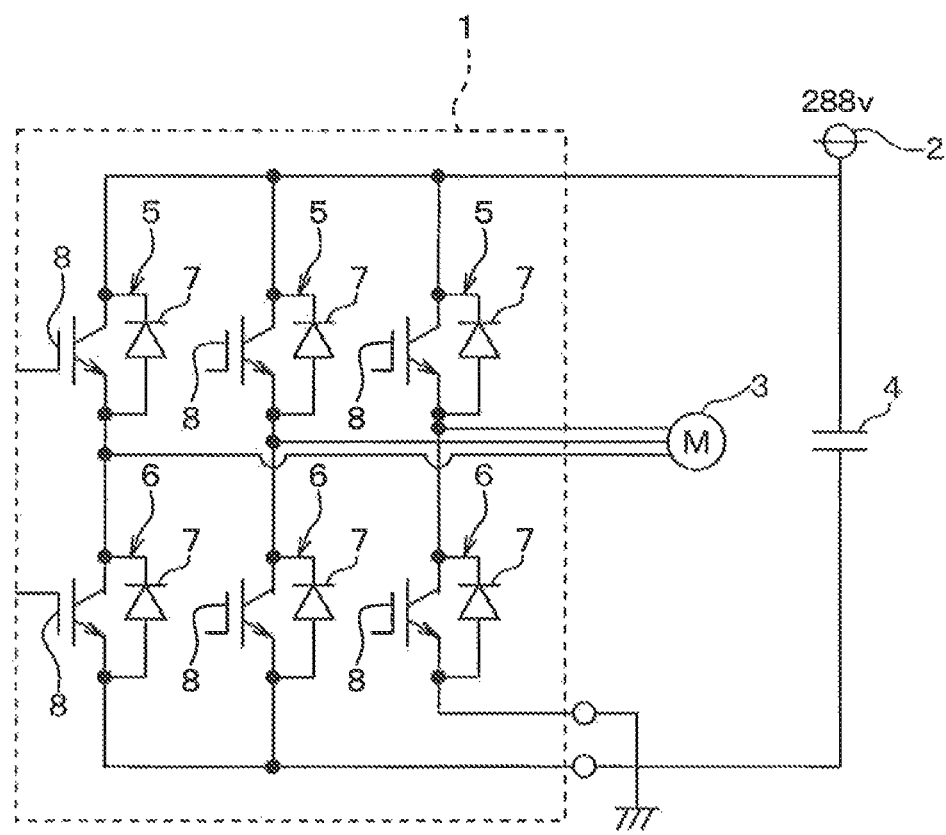
FIG. 1 is a circuit diagram of an inverter constructed with a semiconductor device according to a first embodiment of the present disclosure.

FIG. 1 is a circuit diagram of an inverter 1. As shown in FIG. 1, the inverter 1 converts a direct-current (DC) power, supplied from a DC power source 2, to an alternating-current (AC) power and drives a three-phase motor 3 (i.e., electrical load) by the AC power.

The inverter 1 includes three legs that are parallel to each other. Each leg includes an upper switch 5 and a lower switch 6 that are connected in series. A potential at a junction between the upper switch 5 and the lower switch 6 of each leg is applied in turn to one of three terminals of the motor 3. Each of the upper switch 5 and the lower switch 6 includes a lateral freewheeling diode (FWD) 7 and a lateral IGBT 8. The lateral IGBT 8 is, turned ON and OFF so that a three-phase AC current can be supplied to the motor 3. Thus, the inverter 1 drives the motor 3.

A smoothing capacitor 4 is connected in parallel to the inverter circuit 1. The capacitor 4 reduces ripple or noise during switching of the lateral IGBT 8 so that a constant power supply voltage can be produced.

Next, structures of the lateral FWD 7 and the lateral IGBT 8 are described with reference to FIGS. 2-5. The lateral FWD 7 and the lateral IGBT 8 of each of the upper switch 5 and the lower switch 6 of each leg can be formed in one chip or formed in separate chips. According to the first embodiment, the lateral FWD 7 and the lateral IGBT 8 are formed in one chip.

Figure 2:
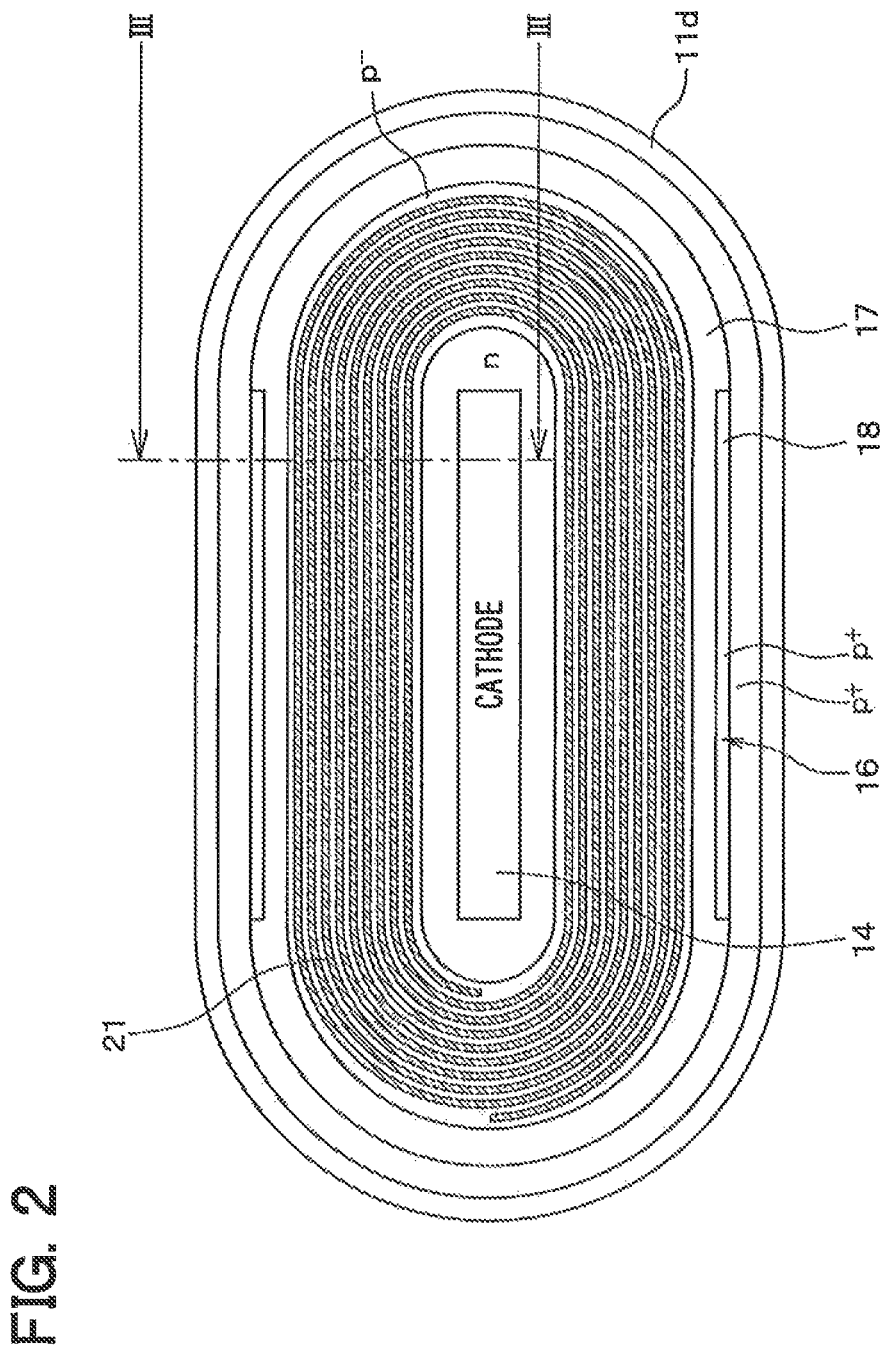
FIG. 2 is a diagram illustrating a top layout view of one cell of a lateral freewheeling diode (FWD) of the semiconductor device.
Figure 3:
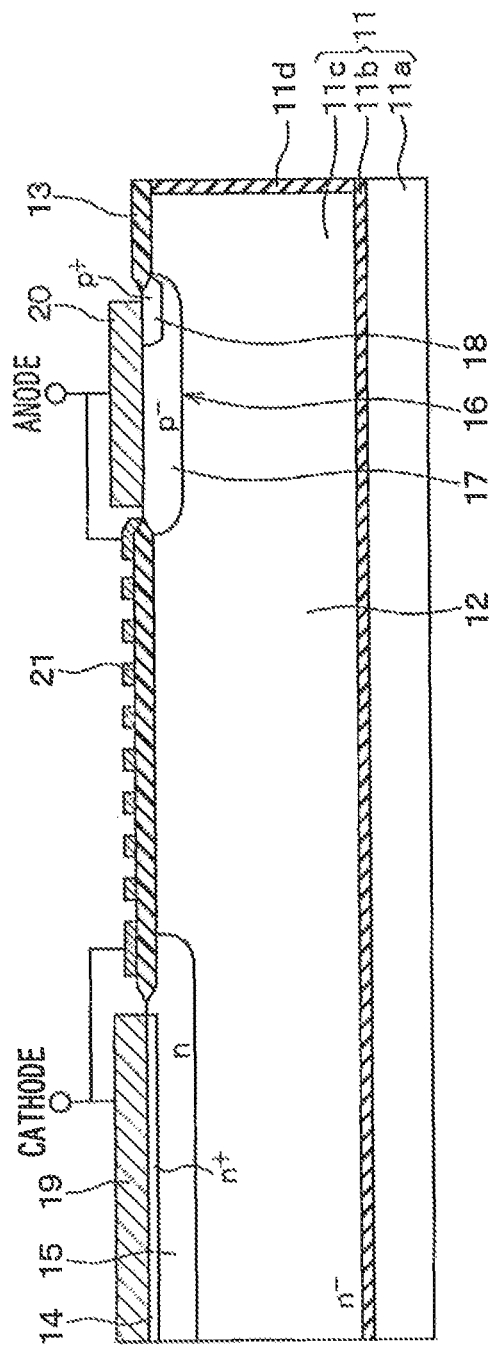
FIG. 3 is a diagram illustrating a cross-sectional view taken along the line III-III in FIG. 2.
Figure 4:
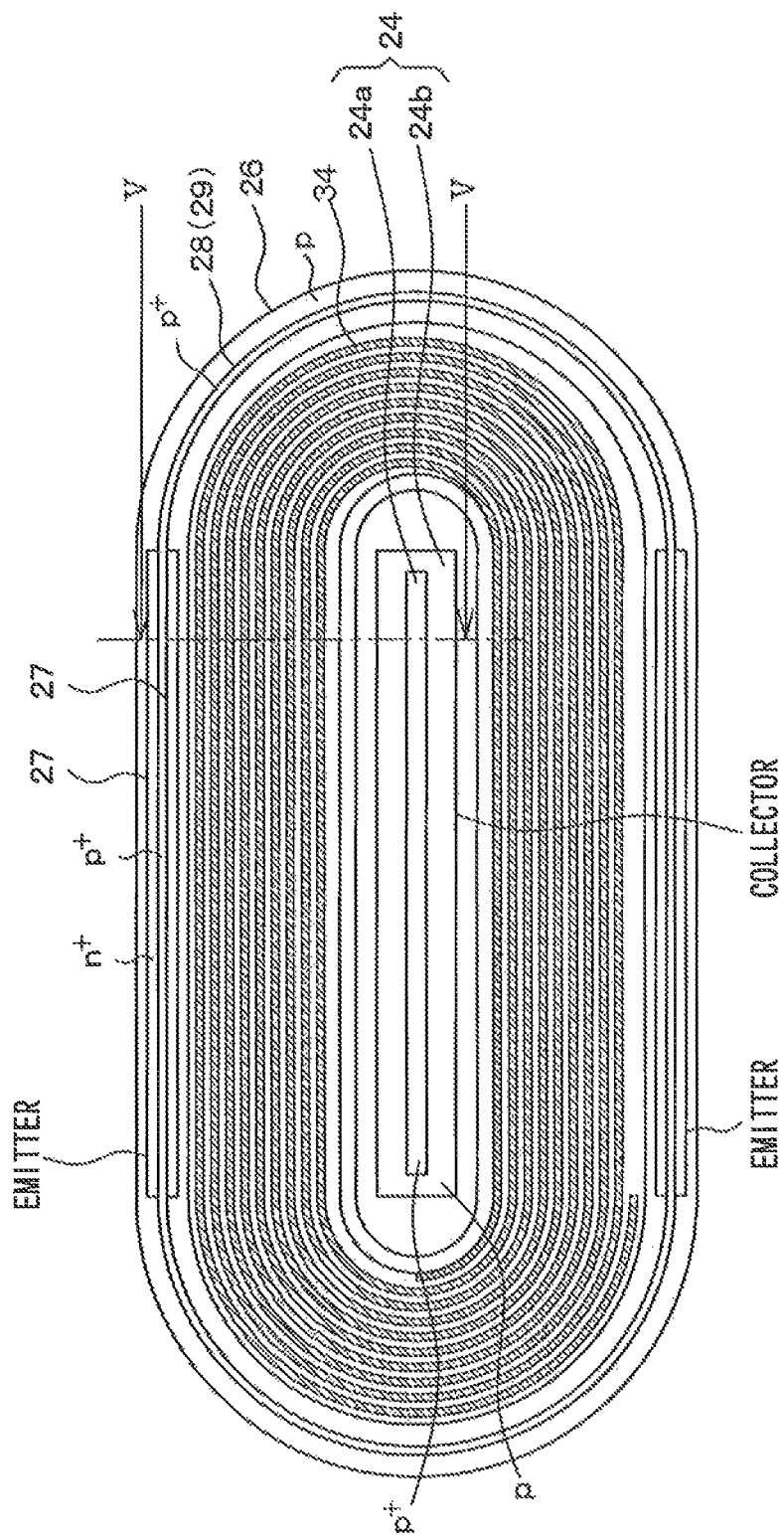
FIG. 4 is a diagram illustrating a top layout view of one cell of a lateral insulated gate bipolar transistor (IGBT) of the semiconductor device.
Figure 5:
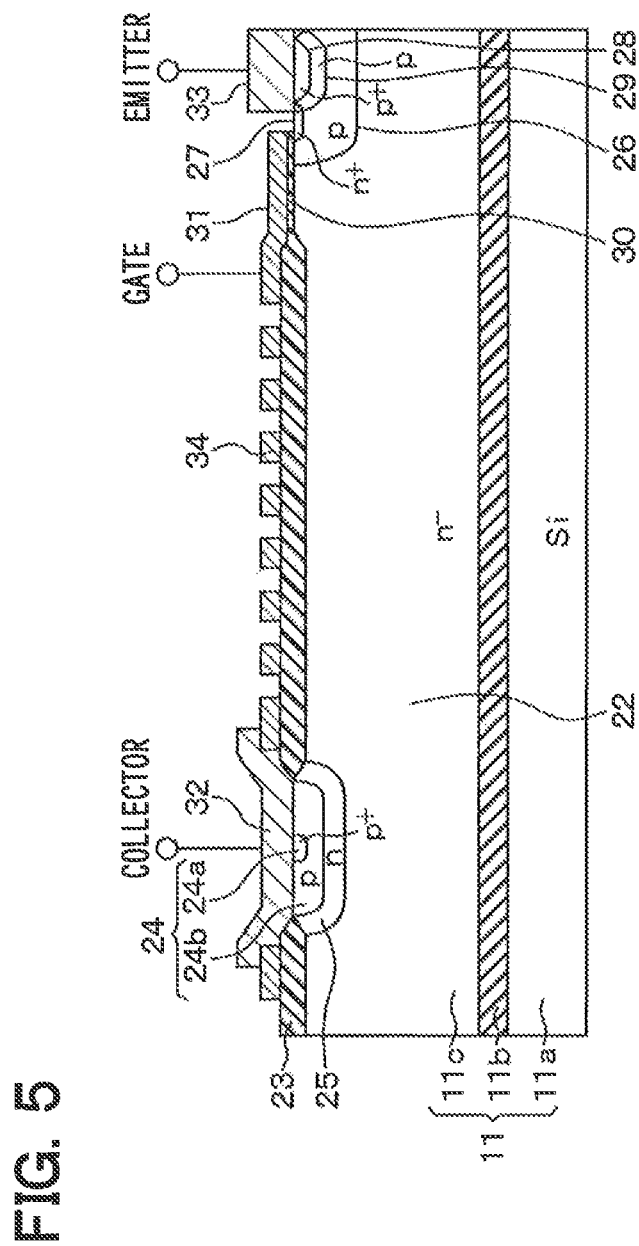
FIG. 5 is a diagram illustrating a cross-sectional view taken along the line V-V in FIG. 4.

FIG. 2 is a diagram illustrating a top layout view of one cell of the lateral FWD 7. FIG. 3 is diagram illustrating a cross-sectional view of the lateral FWD 7 taken along the line in FIG. 2. FIG. 4 is a diagram illustrating a top layout view of one cell of the lateral IGBT 8. FIG. 5 is diagram illustrating a cross-sectional view of the lateral IGBT 8 taken along the line V-V in FIG. 5.

Firstly, the structure of the lateral FWD 7 is described with reference to FIGS. 2 and 3. As shown in FIG. 3, according to the first embodiment, the lateral FWD 7 is formed by using a SOI substrate 11. The SOI substrate 11 includes a supporting substrate 11a, a buried oxide layer (BOX) 11b on the supporting substrate 11a, and an active layer 11c on the BOX layer 11b. The supporting substrate 11a and the active layer 11c are made of silicon. The BOX layer 11b serves as an electrical insulation layer. The active layer 11c serves as an n$^-$-type drift layer 12.

The thickness of the BOX layer 11b is not limited to a specific value. The thickness and impurity concentration of the active layer 11c (i.e., drift layer 12) are not limited to specific values. The thickness of the BOX layer 11b and the thickness and impurity concentration of the active layer 11c are set so that the lateral FWD 7 can have a predetermined voltage breakdown. According to the first embodiment, these values are set as follows: The thickness of the BOX later 11b ranges from 2 μm to 10 μm, preferably, 5 μm or more. The thickness of the active layer 11c ranges from 3 μm to 20 μm. The impurity concentration of the active layer 11c is $7.0\times10^{14}$ cm$^{-3}$. A trench isolation structure 11d is formed on the SOT substrate 11. The lateral FWD 7 is surrounded with the trench isolation structure 11d and isolated from other elements by the trench isolation structure 11d. The trench isolation structure 11d is a conventional element isolation structure. For example, the trench isolation structure 11d can have a trench extending from a surface of the active layer 11c to the BOX layer 11b through the active layer 11c, and the trench can be filled with an insulation layer, a polysilicon, or the like.

A LOCal Oxidation of Silicon (LOCOS) layer 13 is formed on a surface of the drift layer 12 and isolates portions of the lateral FWD 7 from each other. An n$^+$-type cathode contact region 14 is formed in a surface portion of the drift layer 12 and exposed outside the LOCOS layer 13. The cathode contact region 14 has a longitudinal direction parallel to the surface of the drift layer 12. The cathode contact region 14 is surrounded with an n-type buffer layer 15. The buffer layer 15 has an impurity concentration greater than that of the drift layer 12. For example, the cathode contact region 14 can have an n-type impurity concentration of $1.0 \times 10^{20}$ cm$^{-3}$ and a depth of 0.2 µm. For example, the buffer layer 15 can have an n-type impurity concentration of $3.0 \times 10^{16}$ cm$^{-3}$ and a depth of 5 µm.

A p-type anode region 16 is formed in the surface portion of the drift layer 12 and exposed outside the LOCOS layer 13. The anode region 16 is arranged circularly around the cathode contact region 14 so that the cathode contact region 14 can be surrounded with the anode region 16. The anode region 16 has a p$^-$-type low impurity concentration portion 17 and a p$^+$-type high impurity concentration portion 18.

The low impurity concentration portion 17 is located closer to the cathode contact region 14 than the high impurity concentration portion 18. Further, a depth of the low impurity concentration portion 17 is greater than a depth of the high impurity concentration portion 18. According to the first embodiment, as shown in FIG. 3, the low impurity concentration portion 17 has an ellipse shape when viewed from the top. Specifically, the low impurity concentration portion 17 has two straight parts extending in parallel to the cathode contact region 14 and two arc-shaped parts connecting ends of the straight parts. For example, the low impurity concentration portion 17 can have the p-type impurity concentration of $3.0 \times 10^{16}$ cm$^{-3}$ and a thickness of 3.1 µm.

The high impurity concentration portion 18 is in contact with a surface of the low impurity concentration portion 17. According to the first embodiment, the high impurity concentration portion 18 is covered with the low impurity concentration portion 17 in such a manner that a surface of the high impurity concentration portion 18 can be exposed outside the low impurity concentration portion 17. As shown in FIG. 3, the high impurity concentration portion 18 has a straight shape when viewed from the top. The high impurity concentration portion 18 is located on each side of the cathode contact region 14. Thus, the total number of the high impurity concentration portions 18 is two. According to the first embodiment, the high impurity concentration portion 18 is formed in a surface portion of the low impurity concentration portion 17 at a position furthest away from the cathode contact region 14. That is, the high impurity concentration portion 18 is located on the far side of the low impurity concentration portion 17 from the cathode contact region 14. For example, the high impurity concentration portion 18 can have the p-type impurity concentration of $1.0 \times 10^{20}$ cm$^{-3}$.

A cathode electrode 19 is formed on the surface of the cathode contact region 14 and electrically connected to the cathode contact region 14. An anode electrode 20 is formed on the surface of the anode region 16 and electrically connected to the anode region 16. The cathode electrode 19 forms an ohmic contact with the cathode contact region 14. The cathode electrode 19 has the same straight shape as the cathode contact region 14 and is formed almost all over the surface of the cathode contact region 14. The anode electrode 20 has a straight shape and is located on each side of the cathode electrode 19. The anode electrode 20 forms a Schottky or ohmic contact with the straight portion of the low impurity concentration portion 17 of the anode region 16. Further, the anode electrode 20 forms an ohmic contact with the high impurity concentration portion 18 of the anode region 16. Thus, the anode electrode 20 is connected to both the low impurity concentration portion 17 and the high impurity concentration portion 18. According to the first embodiment, the anode electrode 20 is formed almost all over the straight portion of the anode region 16.

A scroll-shaped field plate (SRFP) 21 is formed on the LOCOS layer 13 between the cathode and the anode. The SRFP 21 is a resistor layer formed by ion implantation into non-doped polysilicon. The SRFP 21 serves to maintain a uniform potential gradient between the cathode and the anode. Specifically, as shown in FIG. 3, the SRFP 21 is wound in a scroll (i.e., spiral) shape around the cathode electrode 19 and then extends toward the anode electrode 20. A first end portion of the SRFP 21 is electrically connected to the cathode electrode 19, and a second end portion of the SRFP 21 is electrically connected to the anode electrode 20. The potential of the SRFP 21 gradually decreases with the distance from the cathode electrode 19 due to a voltage drop caused by an internal resistance of the SRFP 21. That is, the potential of the SRFP 21 gradually decreases in a direction from the first end portion of the SRFP 21 to the second end portion of the SRFP 21. In other words, the potential of the SRFP 21 gradually decreases in a direction from the cathode electrode 19 to the anode electrode 20. Thus, the potential gradient in the SRFP 21 can be maintained uniform. Accordingly, the potential gradient in the drift layer 12, which is located below the SRFP 21 across the LOCOS layer 13, can be maintained uniform. Thus, electric field concentration resulting from non-uniform potential gradient is reduced so that the voltage breakdown can be improved. Further, impact ionization is reduced so that an increase in turn-off switching time can be reduced. According to the first embodiment, an impurity concentration of the SRFP 21 is set so that a variation in the breakdown voltage of the lateral FWD 7 can be reduced. The impurity concentration of the SRFP 21 is described in detail later.

As described above, in the lateral FWD 7 of the first embodiment, while the anode electrode 20 forms a Schottky or ohmic contact with the low impurity concentration portion 17, the anode electrode 20 forms an ohmic contact with the high impurity concentration portion 18. Since the anode electrode 20 is electrically connected to the low impurity concentration portion 17, the amount of injected electrons becomes small so that the amount of injected holes can be reduced without reducing the amount of current. Thus, the reverse recovery charge Qrr is reduced so that the reverse recovery capability can be improved. Further, since the amount of injected holes is reduced, the lateral FWD 7 can operate fast without lifetime control.

Next, the structure of the lateral IGBT 8 is described with reference to FIGS. 4 and 5. As shown in FIG. 5, according to the first embodiment, the lateral IGBT 8 is formed on the SOI substrate 11 where the lateral FWD 7 is formed. That is, the lateral FWD 7 and the lateral IGBT 8 are formed on the same SOI substrate 11. Although not shown in FIG. 5, the lateral IGBT 8 is surrounded with the trench isolation structure 11*d* and isolated from other elements by the trench isolation structure 11*d*.

The active layer 11*c* also serves as an n$^-$-type drift layer 22, and portions of the lateral IGBT 8 are formed in the surface portion of the drift layer 22. As mentioned previously, the thickness of the BOX layer 11*b* is not limited to a specific value. The thickness and impurity concentration of the active layer 11*c* (i.e., drift layer 22) are not limited to specific values. The thickness of the BOX layer 11*b* and the thickness and impurity concentration of the active layer 11*c* are set so that the lateral IGBT 8 can have a predetermined breakdown voltage. For example, the thickness of the BOX later 11*b* can range from 2 µm to 10 µm. To obtain a stable breakdown voltage of 600 volts or more, it is preferable to set the values as follows: The thickness of the BOX layer 11b is 5 μm or more. The n-type impurity concentration of the active layer 11c ranges from $1×10^{14}$ cm$^{-3}$ to $1.2×10^{15}$ cm$^{-3}$, if the thickness of the active layer 11c is 15 μm or less. The n-type impurity concentration of the active layer 11c ranges from $1×10^{14}$ cm$^{-3}$ to $8×10^{14}$ cm$^{-3}$, if the thickness of the active layer 11c is 20 μm.

A LOCOS layer 23 is formed on a surface of the drift layer 22 and isolates the portions of the lateral IGBT 8 from each other. A collector region 24 is formed in the surface portion of the drift layer 22 and exposed outside the LOCOS layer 23. As shown in FIG. 5, the collector region 24 has a longitudinal direction parallel to the surface of the drift layer 22. The collector region 24 has a p$^+$-type portion 24a and a p-type portion 24b. An impurity concentration of the p$^+$-type portion 24a is relatively high. An impurity concentration of the p-type portion 24b is less than the impurity concentration of the p$^+$-type portion 24a.

For example, a surface impurity concentration of the p$^+$-type portion 24a can range from $1×10^{19}$ cm$^{-3}$ to $1×10^{20}$ cm$^{-3}$, and a surface impurity concentration of the p-type portion 24b can range from $1×10^{16}$ cm$^{-3}$ to $1×10^{19}$ cm$^{-3}$ or can range from $1×10^{15}$ cm$^{-3}$ to $1×10^{18}$ cm$^{-3}$. As shown in FIGS. 4 and 5, according to the first embodiment, each of the p$^+$-type portion 24a and the p-type portion 24b has a straight shape extending parallel to the surface of the drift layer 22. The p$^+$-type portion 24a is covered with the p-type portion 24b in such a manner that a surface of the p$^+$-type portion 24a can be exposed outside the p-type portion 24b.

The collector region 24 is surrounded with an n-type buffer layer 25. The buffer layer 25 has an impurity concentration greater than that of the drift layer 22. The buffer layer 25 serves as a field stop (FS) layer and prevents expansion of a depletion layer. Thus, the breakdown voltage of the lateral IGBT 8 is improved, and a steady-state loss is reduced. For example, the n-type impurity concentration of the buffer layer 25 can range from $4×10^{16}$ cm$^{-3}$ to $1×10^{18}$ cm$^{-3}$.

Further, a p-channel well layer 26, an n$^+$-type emitter region 27, a p$^+$-type contact layer 28, and a p-type body layer 29 are formed in the surface portion of the drift layer 22 around the collector region 24 and exposed outside the LOCOS layer 23.

A surface portion of the well layer 26 serves a channel region. For example, the thickness of the well layer 26 can be 2 μm or less, and the width of the well layer 26 can be 6 μm or less. As shown in FIG. 5, the well layer 26 is arranged concentrically with respect to the collector region 24 so that the collector region 24 can be entirely surrounded with the well layer 26. That is, the well layer 26 is shaped like a closed ring, and the collector region 24 is located inside the well layer 26.

The emitter region 27 is formed in a surface portion of the well layer 26 and terminated inside the well layer 26. The emitter region 27 extends in the longitudinal direction of the collector region 24. The emitter region 27 has a straight shape and is located parallel to the collector region 24 except ends (i.e., rounded portions) of the collector region 24 in the longitudinal direction. According to the first embodiment, as shown in FIG. 5, the emitter region 27 is located on each side of the contact layer 28 and the body layer 29.

The contact layer 28 fixes the well layer 26 to an emitter potential and has an impurity concentration greater than that of the well layer 26. As shown in FIG. 5, the contact layer 28 is arranged concentrically with respect to the collector region 24 so that the collector region 24 can be entirely surrounded with the contact layer 28. That is, the contact layer 28 is shaped like a closed ring, and the collector region 24 is located inside the contact layer 28.

The body layer 29 reduces a voltage drop whish is caused by a Hall current flowing from a collector to an emitter. The body layer 29 is arranged concentrically with respect to the collector region 24 so that the collector region 24 can be entirely surrounded with the body layer 29. That is, the body layer 29 is shaped like a closed ring, and the collector region 24 is located inside the body layer 29. The body layer 29 reduces or prevents operation of a parasitic non transistor, which is constructed with the emitter region 27, the well layer 26, and, the drift layer 22. Thus, turn-off time can be improved.

In each cell, as shown in FIG. 5, the well layer 26, the emitter region 27, the contact layer 28, and the body layer 29 are arranged on each side of the collector region 24.

A gate electrode 31 is located on a surface of the well layer 26 through a gate insulating layer 30. For example, the gate electrode 31 can be made of doped polysilicon. The surface portion of the well layer 26 becomes the channel region by applying a predetermined voltage to the gate electrode 31.

A collector electrode 32 is located on a surface of the collector region 24 and electrically connected to the collector region 24. Further, an emitter electrode 33 is located on surfaces of the emitter region 27 and the contact layer 2 and electrically connected to the emitter region 27 and the contact layer 28.

The collector electrode 32 forms an ohmic contact with the p$^4$-type portion 24a and forms a Schottky contact with the p-type portion 24b.

A scroll-shaped field plate (SRFP) 34 is formed on the LOCOS layer 23 between the collector and the gate. The SRFP 34 is a resistor layer formed by ion implantation into non-doped polysilicon. The SRFP 34 serves to maintain a uniform potential gradient between the collector and the gate. Specifically, as shown in FIG. 4, the SRFP 34 is wound in a scroll (i.e., spiral) shape around the collector electrode 32 and extends toward the emitter electrode 33. A first end portion of the SRFP 34 is electrically connected to the collector electrode 32, and a second end portion of the SRFP 34 is electrically connected to the gate electrode 31. The potential of the SRFP 34 gradually decreases with the distance from the collector electrode 32 due to a voltage drop caused by an internal resistance of the SRFP 34. That is, the potential of the SRFP 34 gradually decreases in a direction from the first end portion of the SRFP 34 to the second end portion of the SRFP 34. In other words, the potential of the SRFP 34 gradually decreases in a direction from the collector electrode 32 to the emitter electrode 33. Thus, the potential gradient in the SRFP 34 can be maintained uniform. Accordingly, the potential gradient in the drift layer 22, which is located below the SRFP 34 across the LOCOS oxide 23, can be maintained uniform. Thus, electric field concentration resulting from non-uniform potential gradient is reduced so that the breakdown voltage can be improved. Further, impact ionization is reduced so that an increase in turn-off switching time can be reduced. According to the first embodiment, an impurity concentration of the SRFP 34 is set so that a variation in the breakdown voltage of the lateral IGBT 8 can be reduced. The impurity concentration of the SRFP 34 is described in detail later. As described above, according to the first embodiment, the second electrode of the SRFP 34 is electrically connected to the gate electrode 31. Alternatively, the second electrode of the SRFP 34 can be electrically connected to the emitter electrode 33.

Next, an operation of the lateral IGBT 8 is described. When the voltage is applied to the gate electrode 31, the channel region appears in the surface portion of the well layer 26, which is located below the gate electrode 31 between the emitter region 27 and the drift layer 22. Then, electrons flow from the emitter electrode 33 and the emitter region 27 into the drift layer 22 through the channel region. Accordingly, holes flow into the drift layer 22 through the collector electrode 32 and the collector region 24. Thus, conductivity modulation occurs in the drift layer 22 so that a large current can flow between the emitter and the collector. In this way, the lateral IGBT 8 operates.

As described above, in the lateral IGBT 8 of the first embodiment, the collector electrode 32 forms an ohmic contact with the $p^+$-type portion 24a and forms a Schottky contact with the p-type portion 24b. Thus, hole injection from the collector can be reduced. In particular, since the hole injection reduction is achieved by the contact condition between the collector electrode 32 and the collector region 24, there is no need that the buffer layer 25 serves to reduce the hole injection. Therefore, the buffer layer 25 is required to serve as at least a field stop layer. For this reason, the impurity concentration of the buffer layer 25 can be reduced to a low level that does not affect the efficiency of the hole injection from the collector.

Next, the impurity concentration of the SRFP 21 of the lateral FWD 7 and the impurity concentration of the SRFP 34 of the lateral IGBT 8 are described in detail. Since the impurity concentration of the SRFP 21 is basically identical to the impurity concentration of the SRFP 34, the following description relates to the impurity concentration of the SRFP 34.

After deep study, the present inventors found out that the second end portion of the SRFP 34 is depleted and that the concentration of holes in the second end portion of the SRFP 34 is reduced due to the depletion. As mentioned above, the potential of the SRFP 34 decreases in the direction from the first end portion of the SRFP 34 to the second end portion of the SRFP 34. That is, the present inventors found out that the hole concentration reduction occurs on the lowest potential side (i.e., on the emitter side rather than on the collector side) of the SRFP 34.

The present inventors concluded that the breakdown voltage variation is caused by the hole concentration reduction. Specifically, an electric field is applied to the SRFP 34 from below through the LOCOS layer 23, and electric field intensity of the SRFP 34 becomes greatest in the second end portion. As a result, the second end portion of the SRFP 34 is depleted so that the concentration of holes in the second end portion of the SRFP 34 can be reduced. When an electric current flows uniformly in the SRFP 34, the resistance of the SRFP 34 is increased in the second end portion due to the hole concentration reduction so that the voltage drop can be increased in the second end portion. As a result, electric field gradient in the drift layer 22 becomes larger on the emitter side than on the collector side. This non-uniform electric field gradient causes the breakdown voltage variation.

Further, the present inventors found out that the influence of the depletion on the breakdown voltage depends on the impurity concentration of the SRFP 34, in particular, the impurity concentration of the second end portion of the SRFP 34. Specifically, the present inventors found out that the influence becomes smaller as the impurity concentration of the SRFP 34 is higher. A reason for this is discussed below with reference to FIGS. 6A-6C.

Figure 6A:
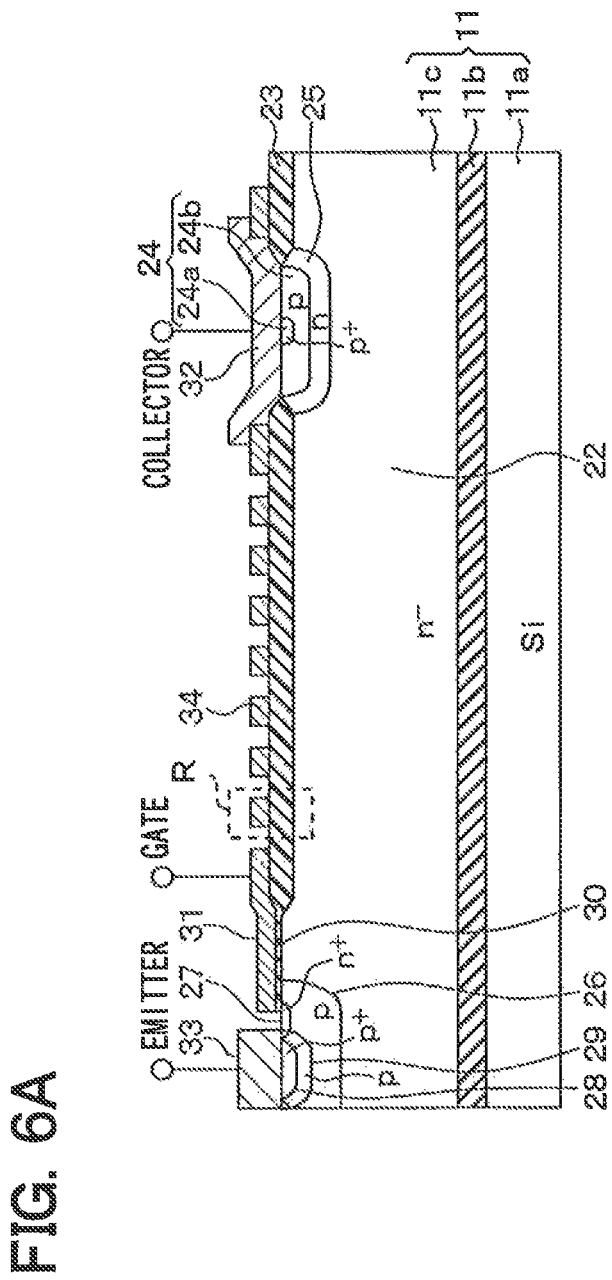
FIG. 6A is a diagram illustrating a cross-sectional view of a lateral IGBT used in an experiment to evaluate a relationship between an impurity concentration and depletion in a scroll-shaped field plate (SRFP) of the IGBT.
Figure 6B:
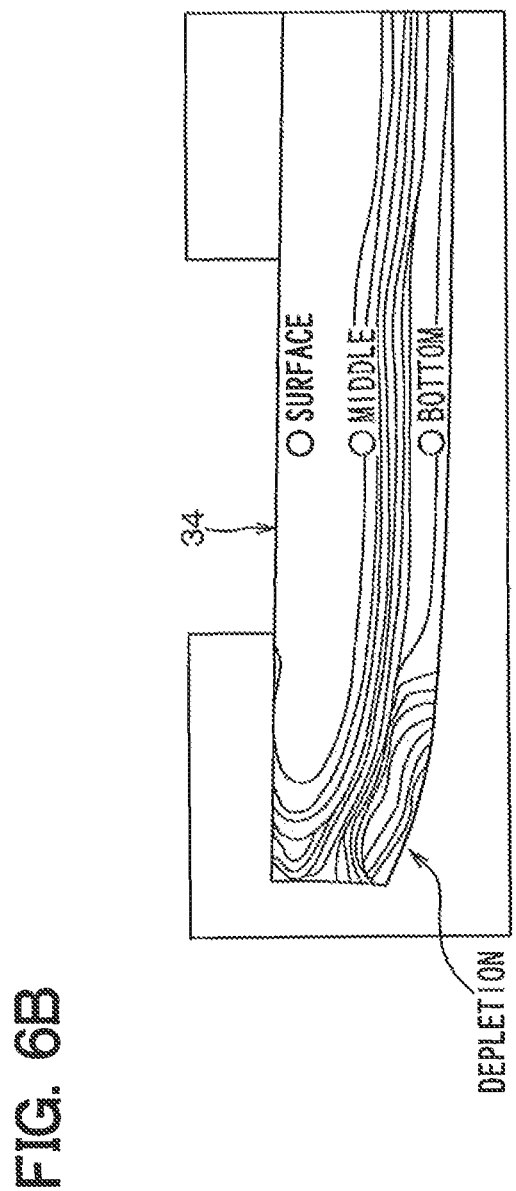
FIG. 6B is a diagram illustrating an enlarged cross-sectional view of an emitter-side end portion of the SRFP indicated by a region R in FIG. 6A and showing an electric field distribution and depletion in the emitter-side end portion of the SRFP.

The present inventors conducted an experiment to evaluate a relationship between the impurity concentration (i.e., hole concentration) and the depletion of the SRFP 34. FIG. 6A is a diagram illustrating the lateral IGBT 8 used in the experiment. FIG. 6A is a mirrored view of FIG. 4. A region R in FIG. 6A indicates the second end portion of the SRFP 34. FIG. 6B is an enlarged cross-sectional view of the region R, i.e., the second end portion of the SRFP 34 and shows an electric field distribution in each of a surface part, a middle part, and a bottom part of the second end portion of the SRFP 34. FIG. 6C is a graph showing a relationship between a set impurity concentration and a measured impurity concentration of each of the surface part, the middle part, and the bottom part of the second end portion of the SRFP 34. In FIG. 6C, the horizontal axis represents the set impurity concentration, and the vertical axis represents the measured impurity concentration. In the lateral IGBT 8 used in the experiment, the thickness of the BOX layer 11b is set to 5 µm, the thickness of the drift layer 22 is set to 15 µm, the thickness of the LOCOS layer 23 is set to 0.6 µm, a collector voltage is set to 600V, a gate voltage is set to 0V, an emitter voltage is set to 0V, and the set impurity concentration is $1.0 \times 10^{14}$ cm$^{-3}$, $1.0 \times 10^{16}$ cm$^{-3}$, $2.5 \times 10^{16}$ cm$^{-3}$, $5.0 \times 10^{16}$ cm$^{-3}$, $7.5 \times 10^{16}$ cm$^{-3}$, $1 \times 10^{17}$ cm$^{-3}$, $2.5 \times 10^{17}$ cm$^{-3}$, $5.0 \times 10^{17}$ cm$^{-3}$, $1.0 \times 10^{18}$ cm$^{-3}$, and $1.0 \times 10^{20}$ cm$^{-3}$.

When the collector voltage is high (i.e., 600V), and each of the gate and emitter voltages is 0V, the potential of the SRFP 34 becomes lowest in the second end portion. In this case, as shown in FIG. 6B, the SRFP 34 starts to be depleted from the bottom part of the second end portion. The result of the experiment shows that a depletion area, over which the depletion spreads, depends on the impurity concentration of the SRFP 34.

In the experiment, a dose (i.e., amount) of an impurity added to the SRFP 34 is adjusted so that the impurity concentration of the second end portion of the SRFP 34 can become the set impurity concentration represented by the horizontal axis of FIG. 6C. The measured impurity concentration represented by the vertical axis of FIG. 6C indicates the actual impurity concentration of the second end portion of the SRFP 34 measured in the experiment ideally, the measured impurity concentration will become equal to the set impurity concentration. However, as can be seen from FIG. 6C, the result of the experiment shows that the measured impurity concentration is smaller than the measured impurity concentration. Specifically, as the set impurity concentration is lower (i.e., as the dose of the impurity added to the SRFP 34 is smaller), the difference between the set impurity concentration and the measured impurity concentration becomes larger. A reason for this trend is that as the impurity concentration of the SRFP 34 is lower, the SRFP 34 is more likely to be depleted. That is, the depletion area of the SRFP 34 depends on the impurity concentration of the second end portion of the SRFP 34. Specifically, as the impurity concentration of the second end portion of the SRFP 34 is lower, the size of the depletion layer of the SRFP 34 becomes larger. In other words, as the impurity concentration of the second end portion of the SRFP 34 is higher, the size of the depletion layer of the SRFP 34 becomes smaller.

More specifically, as shown FIG. 6, in the surface part of the second end portion of the SRFP 34, the difference between the set impurity concentration and the measured impurity concentration is small regardless of the set impurity concentration. In the middle part and the bottom part of the second end portion of the SRFP 34, the difference between the set impurity concentration and the measured impurity concentration is very large when the set impurity concentration is less than $1 \times 10^{18}$ cm$^{-3}$. Based on this result, the present inventors concluded that the depletion area of the SRFP 34 can be limited by setting the set impurity concentration of the second end portion of the SRFP 34 to a value equal to or greater than $1 \times 10^{18}$ cm$^{-3}$.

Figure 7A:
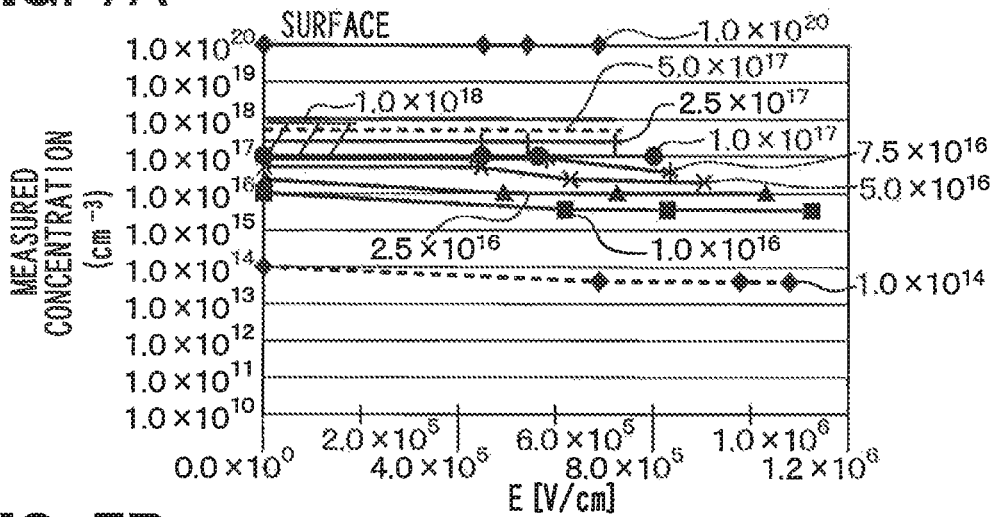
FIG. 7A is a diagram illustrating a relationship between an electric field intensity and the measured impurity concentration of the surface part of the emitter-side end portion of the SRFP.
Figure 7B:
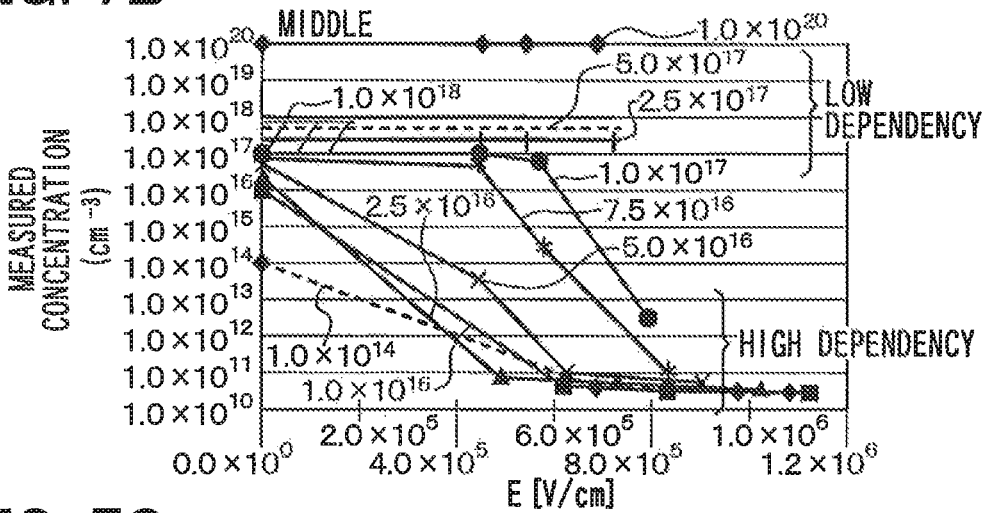
FIG. 7B is a diagram illustrating a relationship between the electric field intensity and the measured impurity concentration of the middle part of the emitter-side end portion of the SRFP.
Figure 7C:
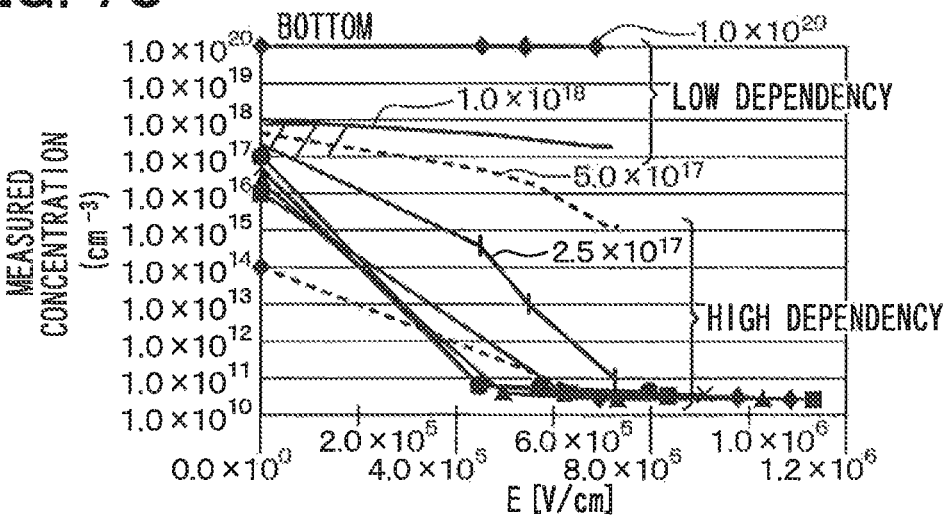
FIG. 7C is a diagram illustrating a relationship between the electric field intensity and the measured impurity concentration of the bottom part of the emitter-side end portion of the SRFP.

Further, the present inventors conducted the experiment by changing the electric field intensity in order to evaluate a relationship between the electric field intensity and the measured impurity concentration of the second end portion of the SRFP 34. Specifically, the collector voltage is changed to 100V, 300V, and 600V so that the electric field intensity can be changed in three levels. It is noted that the electric field intensity is measured in the drift layer 22 directly below the LOCOS layer 23 on which the second end portion of the SRFP 34 is located. FIGS. 7A, 7B, and 7C are graphs showing the result of the experiment FIG. 7A shows a relationship between the electric field intensity and the measured impurity concentration of the surface part of the second end portion of the SRFP 34. FIG. 7B shows a relationship between the electric field intensity and the measured impurity concentration of the middle part of the second end portion of the SRFP 34. FIG. 7C shows a relationship between the electric field intensity and the measured impurity concentration of the bottom part of the second end portion of the SRFP 34. In FIGS. 7A-7C, the measured impurity concentration when the electric field intensity is $0.0 \times 10^0$ ($=0$) V/cm corresponds to the set impurity concentration.

As shown in FIG. 7A, in the surface part, the difference between the set impurity concentration and the measured impurity concentration is small regardless of the set impurity concentration and the electric field intensity. In contrast, as shown in FIGS. 7B and 7C, in the middle part and the bottom part, the difference between the set impurity concentration and the measured impurity concentration is large, when the set impurity concentration is small and the electric field intensity is high. In other words, in the middle part and the bottom part, when the set impurity concentration is low, the dependence of the measured impurity concentration on the electric field intensity is high. However, even in the middle part and the bottom part, when the set impurity concentration is high, the dependence of the measured impurity concentration on the electric field intensity is low. Specifically, in the middle part and the bottom part, when the set impurity concentration is equal to or greater than $1 \times 10^{18}$ cm$^{-3}$, the difference between the set impurity concentration and the measured impurity concentration is small regardless of the electric field intensity so that the dependence of the measured impurity concentration on the electric field intensity can be low.

Further, the present inventors conducted the experiment to evaluate the measured impurity concentration and the depletion area in the first end portion (i.e., on the collector side), the second end portion (i.e., on the emitter side), and a middle portion between the first and second end portions of the SRFP 34. In the experiment, the set impurity concentration is changed to $1 \times 10^{14}$ cm$^{-3}$, $1 \times 10^{16}$ cm$^{-3}$, $1 \times 10^{17}$ cm$^{-3}$, $1 \times 10^{18}$ cm$^{-3}$, and $1 \times 10^{20}$ cm$^{-3}$. The set impurity concentration of $1 \times 10^{14}$ cm$^{-3}$, $1 \times 10^{16}$ cm$^{-3}$, $1 \times 10^{17}$ cm$^{-3}$, $1 \times 10^{18}$ cm$^{-3}$, and $1 \times 10^{20}$ cm$^{-3}$ corresponds to the impurity dose of $2.6 \times 10^9$ cm$^{-2}$, $2.6 \times 10^{11}$ cm$^{-3}$, $2.6 \times 10^{12}$ cm$^{-2}$, $2.6 \times 10^{13}$ cm$^{-2}$, and $2.6 \times 10^{15}$ cm$^{-2}$, respectively. The result of the experiment shows that in the second portion of the SRFP 34, when the set impurity concentration is small, the measured impurity concentration is reduced below the set impurity concentration. In contrast, in the middle portion and the first end portion of the SRFP 34, even when the set impurity concentration is small, the measured impurity concentration is almost equal to the set impurity concentration. Further, when the set impurity concentration is small, the second portion of the SRFP 34 is depleted. In contrast, even when the set impurity concentration is small, the middle portion and the first end portion of the SRFP 34 are not depleted. Further, the result of the experiment shows that when the set impurity concentration is equal to or greater than $1 \times 10^{18}$ cm$^{-3}$, each of the measured impurity concentration reduction and the depletion does not occur in any of the first end portion, the second end portion, and the middle portion of the SRFP 34.

Figure 8A:
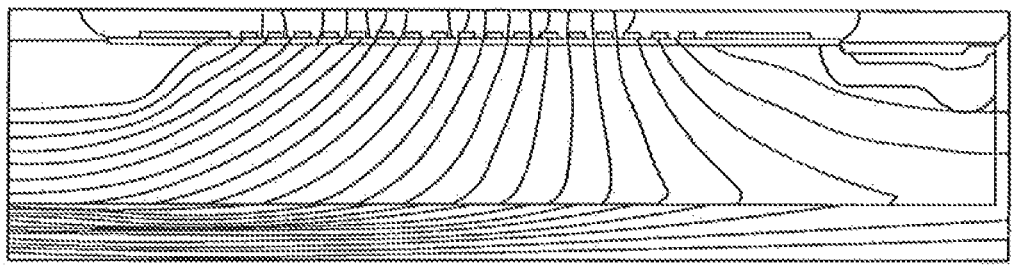
FIG. 8A is a diagram illustrating a cross-sectional view of the lateral IGBT and showing the electric field distribution in the lateral IGBT observed when the set impurity concentration of the SRFP is low.
Figure 8B:
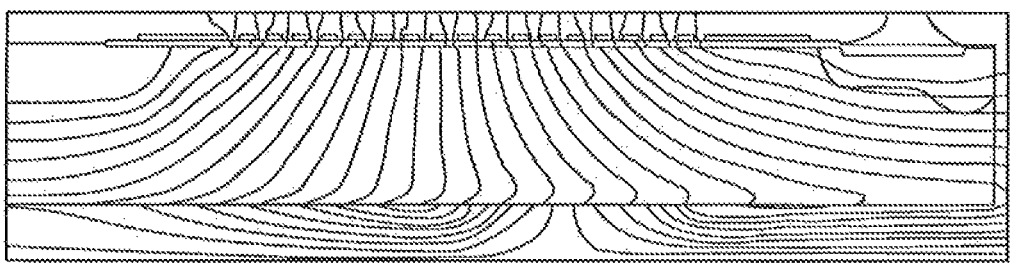
FIG. 8B is a diagram illustrating a cross-sectional view of the lateral IGBT and showing the electric field distribution in the lateral IGBT observed when the set impurity concentration of the SRFP is $1\times10^{18}$ cm$^{-3}$ or more.

As described above, when the set impurity concentration of the SRFP 34 is low, the second end portion of the SRFP 34 is depleted so that the measured impurity concentration of the second end portion of the SRFP 34 can be reduced below the set impurity concentration. As a result, the resistance of the SRFP 34 becomes non-uniform so that the electric field gradient in the drift layer 22 becomes non-uniform, FIG. 8A illustrates the electric field distribution observed when the set impurity concentration of the SRFP 34 is low. FIG. 8B illustrates the electric field distribution observed when the set impurity concentration of the SRFP 34 is equal to or greater than $1 \times 10^{18}$ cm$^{-3}$.

As shown in FIG. 8A, when the set impurity concentration is low, the electric field gradient is large on the second end portion side (i.e., on the emitter side) of the SRFP 34 and small on the first end portion, side (i.e., on the collector side) of the SRFP 34. As a result, the electric field gradient becomes nonuniform. Thus, the electric field is not suitably reduced on the second end portion side of the SRFP 34 so that the breakdown voltage variation can occur. In contrast, as shown in FIG. 8B, when the set impurity concentration of the SRFP 34 is equal to or greater than $1 \times 10^{18}$ cm$^{-3}$, the electric field gradient becomes almost uniform so that the breakdown voltage variation can be reduced.

As described above, the depletion area of the SRFP 34 can be limited by setting the impurity concentration of (at least the second end portion of) the SRFP 34 to a value equal to or greater than $1 \times 10^{18}$ cm$^{-3}$. In such an approach, the reduction in the impurity concentration (i.e., the hole concentration) of the SRFP 34 is reduced so that the gradient of the electric field in the drift layer 22 can be almost uniform. Thus, the variation in the breakdown voltage of the lateral IGBT 8 can be reduced.

Figure 9:
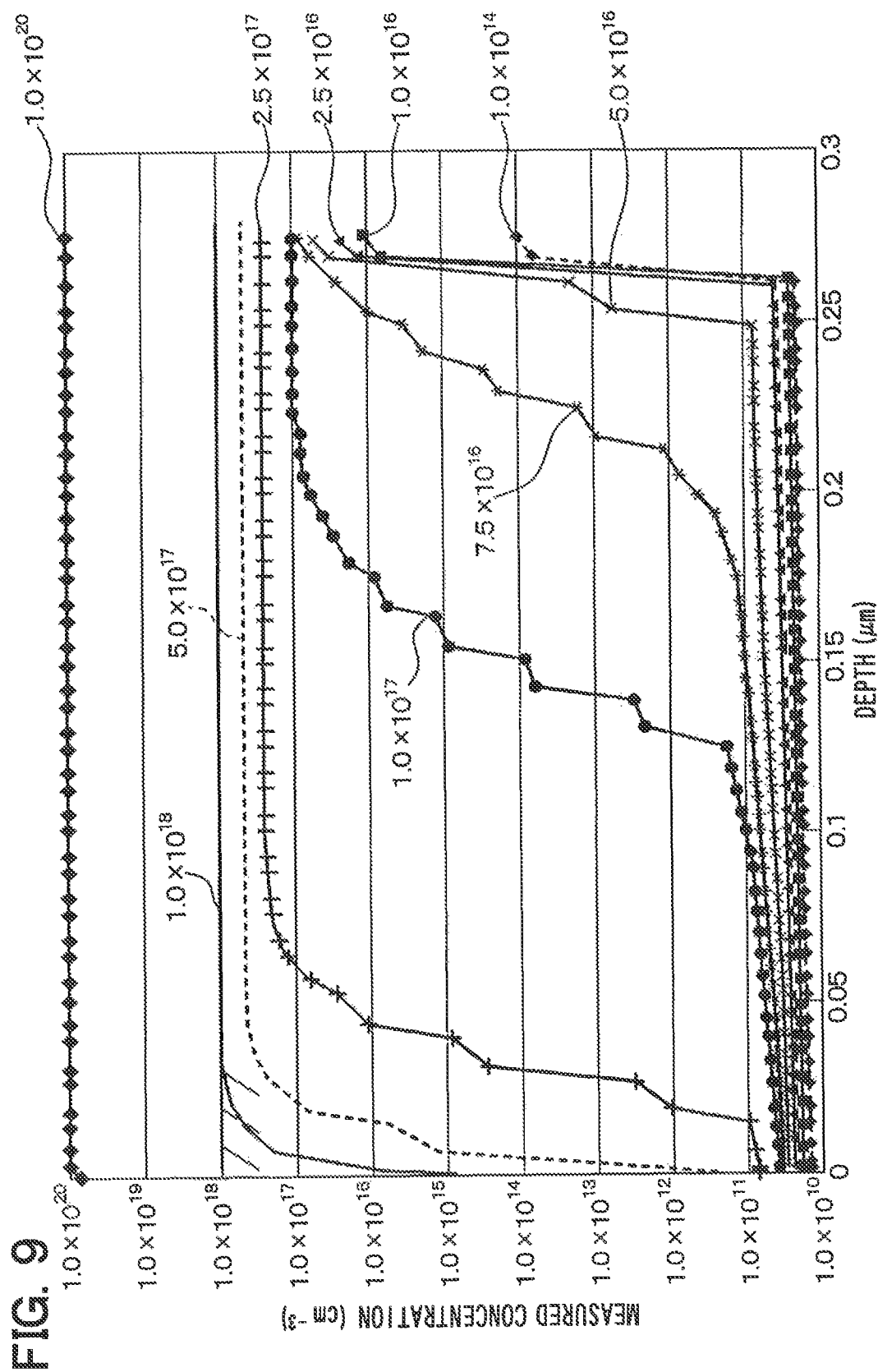
FIG. 9 is a diagram illustrating a relationship between the measured impurity concentration of the emitter-side end portion of the SRFP and a depth from a surface of the emitter-side end portion of the SRFP.
Figure 10:
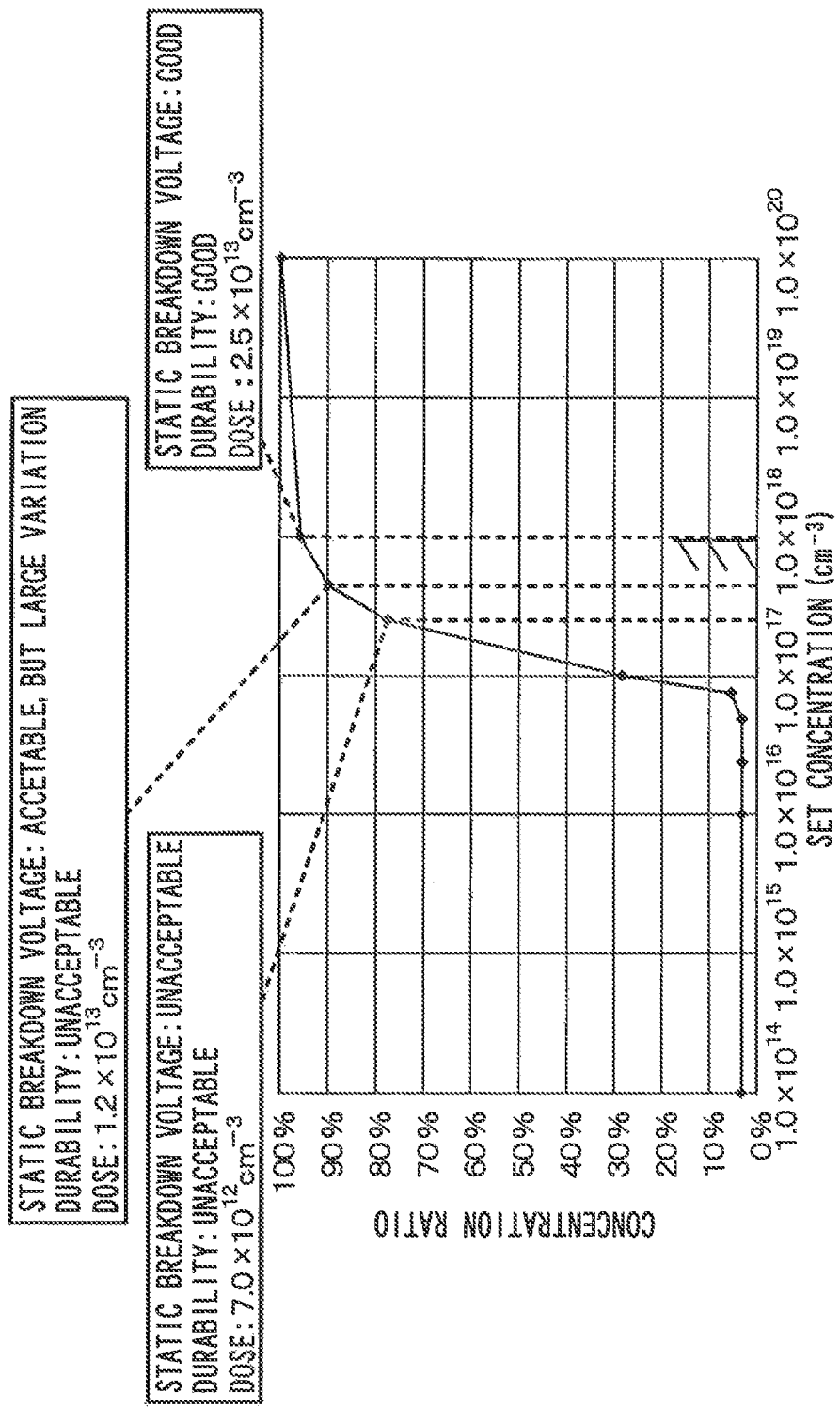
FIG. 10 is a diagram illustrating a relationship between the set impurity concentration of the SRFP and a concentration ratio between the set impurity concentration and the measured impurity concentration.

The present inventors evaluated a relationship between the measured impurity concentration of the second end portion of the SRFP 34 and a depth from a surface of the second end portion of the SRFP 34, FIG. 9 is a diagram illustrating the evaluated relationship between the measured impurity concentration of the second end portion of the SRFP 34 and the depth from the surface of the second end portion of the SRFP 34. FIG. 10 is a diagram created based on the evaluation result shown in FIG. 9 and illustrates a relationship between a concentration ratio and the set impurity concentration of the SRFP 34. The concentration ratio represents a ratio of the measured impurity concentration to the set impurity concentration.

As shown in FIG. 10, when the set impurity concentration is less than $1 \times 10^{18}$ cm$^{-3}$ (i.e., when the impurity dose is less than $2.5 \times 10^{13}$ cm$^{-2}$), the concentration ratio is low. The present inventors evaluated a static breakdown voltage and durability of the lateral IGBT 8 in three cases. In the first case, the impurity dose is set to $2.5 \times 10^{13}$ cm$^{-2}$ so that the set impurity concentration can be $1 \times 10^{18}$ cm$^{-3}$. In the second case, the impurity dose is set to $1.2 \times 10^{13}$ cm$^{-2}$ so that the set impurity concentration can be less than $1 \times 10^{18}$ cm$^{-3}$. In the third case, the impurity dose is set to $7.0 \times 10^{12}$ cm$^{-2}$ so that the set impurity concentration can be less than $1 \times 10^{18}$ cm$^{-3}$. As shown in FIG. 10, in the first case, the static breakdown voltage and the durability are good. In contrast, in the second and third cases, the static breakdown voltage and the durability are unacceptable. Specifically, in the second case, the static breakdown voltage is acceptable, but a variation in the static breakdown voltage is large. Therefore, in the second case, the static breakdown voltage is considered unacceptable. From the evaluation result shown in FIG. 10, the depletion, the impurity concentration reduction, and the non-uniform electric field gradient can be reduced by setting the impurity concentration of the SRFP 34 to a value equal to or greater than $1\times10^{18}$ cm$^{-3}$.

Figure 11:
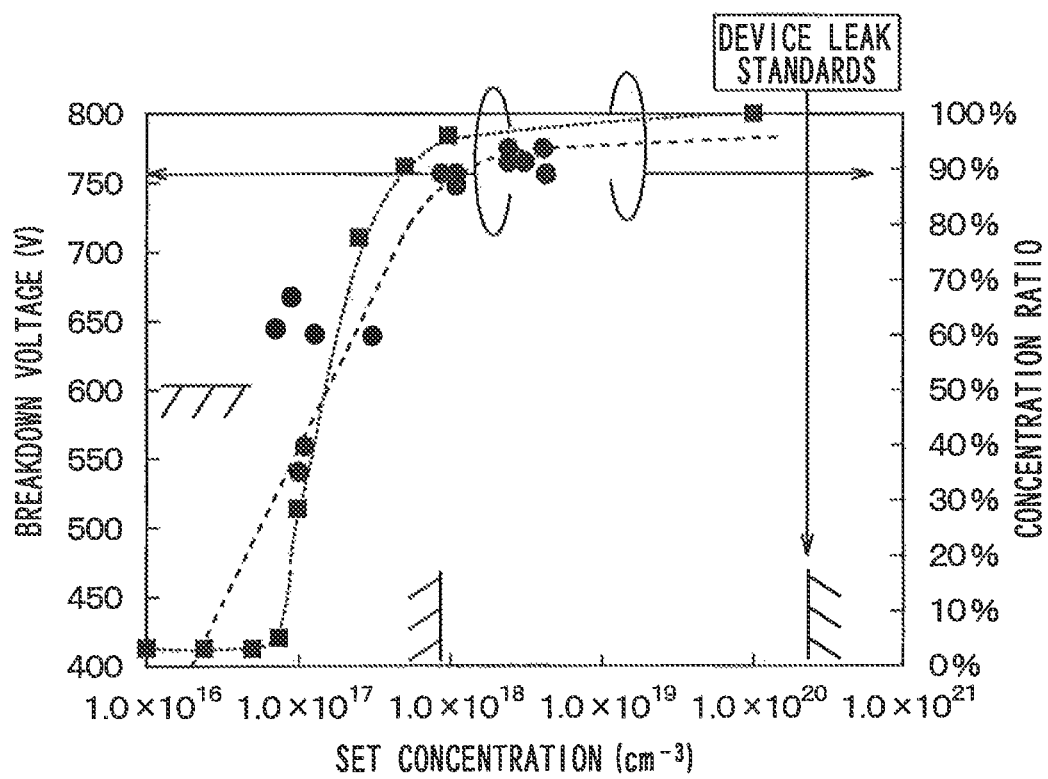
FIG. 11 is a diagram illustrating a relationship between the set impurity concentration of the SRFP and a breakdown voltage of the lateral IGBT.

Further, the present inventors evaluated a relationship between a collector-to-emitter breakdown voltage and the set impurity concentration of the SRFP 34. FIG. 11 shows the evaluated relationship between the breakdown voltage and the set impurity concentration. Further, FIG. 11 shows the relationship between the concentration ratio and the set impurity concentration, which is shown in FIG. 10. In FIG. 11, a solid circle represents the relationship between the breakdown voltage and the set impurity concentration, and a solid square represents the relationship between the concentration ratio and the set impurity concentration.

As shown in FIG. 11, when the set impurity concentration is equal to or greater than $1\times10^{18}$ cm$^{-3}$, the concentration ratio is almost 100%, and the breakdown voltage is 750V or more. In contrast, when the set impurity concentration is reduced below $1\times10^{18}$ cm$^{-3}$, the concentration ratio starts to decrease, and the breakdown voltage also starts to decrease. When the set impurity concentration is equal to or greater than $1\times10^{17}$ cm$^{-3}$, a high breakdown voltage of 500V can be ensured. In this case, however, a variation in the breakdown voltage occurs. In order to ensure a stable high breakdown voltage, therefore, it is preferable that the set impurity concentration be equal to or greater than $1\times10^{18}$ cm$^{-3}$. It is noted that the breakdown voltage can be increased by increasing the set impurity concentration. However, in view of a device leak current standards, it is preferable that the set impurity concentration be equal to or less than $2\times10^{20}$ cm$^{-3}$.

Figure 12A:
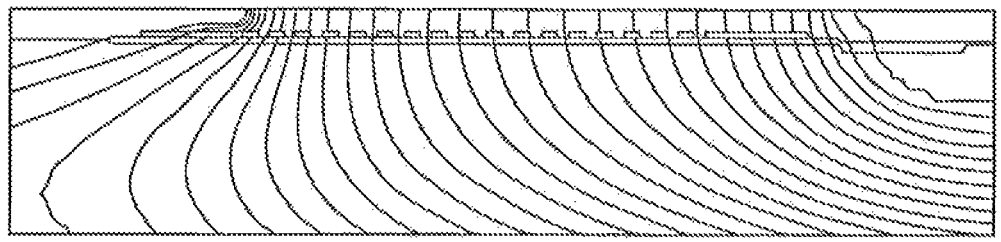
FIG. 12A is a diagram illustrating a cross-sectional view of the lateral IGBT and showing the electric field distribution in the lateral IGBT observed when the set impurity concentration of the SRFP is $1\times10^{14}$ cm$^{-3}$.
Figure 12B:
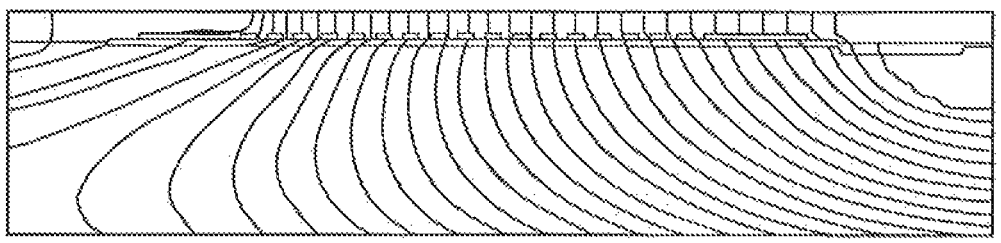
FIG. 12B is a diagram illustrating a cross-sectional view of the lateral IGBT and showing the electric field distribution in the lateral IGBT observed when the set impurity concentration of the SRFP is $1\times10^{17}$ cm$^{-3}$.
Figure 12C:
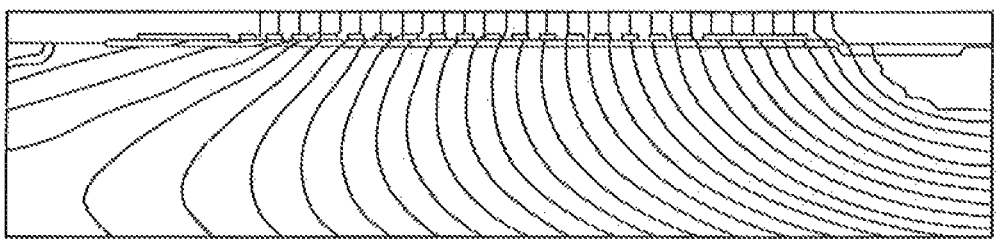
FIG. 12C is a diagram illustrating a cross-sectional view of the lateral IGBT and showing the electric field distribution in the lateral IGBT observed when the set impurity concentration of the SRFP is $1\times10^{20}$ cm$^{-3}$.

The present inventors evaluated a potential and a potential difference in the drift layer 22 directly below the LOCOS layer 23 under conditions where the electric field gradient is non-uniform as shown in FIGS. 12A-12C. In the condition shown in FIG. 12A, the set impurity condition of the SRFP 34 is $1\times10^{14}$ cm$^{-3}$. In the condition shown in FIG. 12B, the set impurity condition of the SRFP 34 is $1\times10^{17}$ cm$^{-3}$. In the condition shown in FIG. 12C, the set impurity condition of the SRFP 34 is $1\times10^{20}$ cm$^{-3}$.

Figure 13:
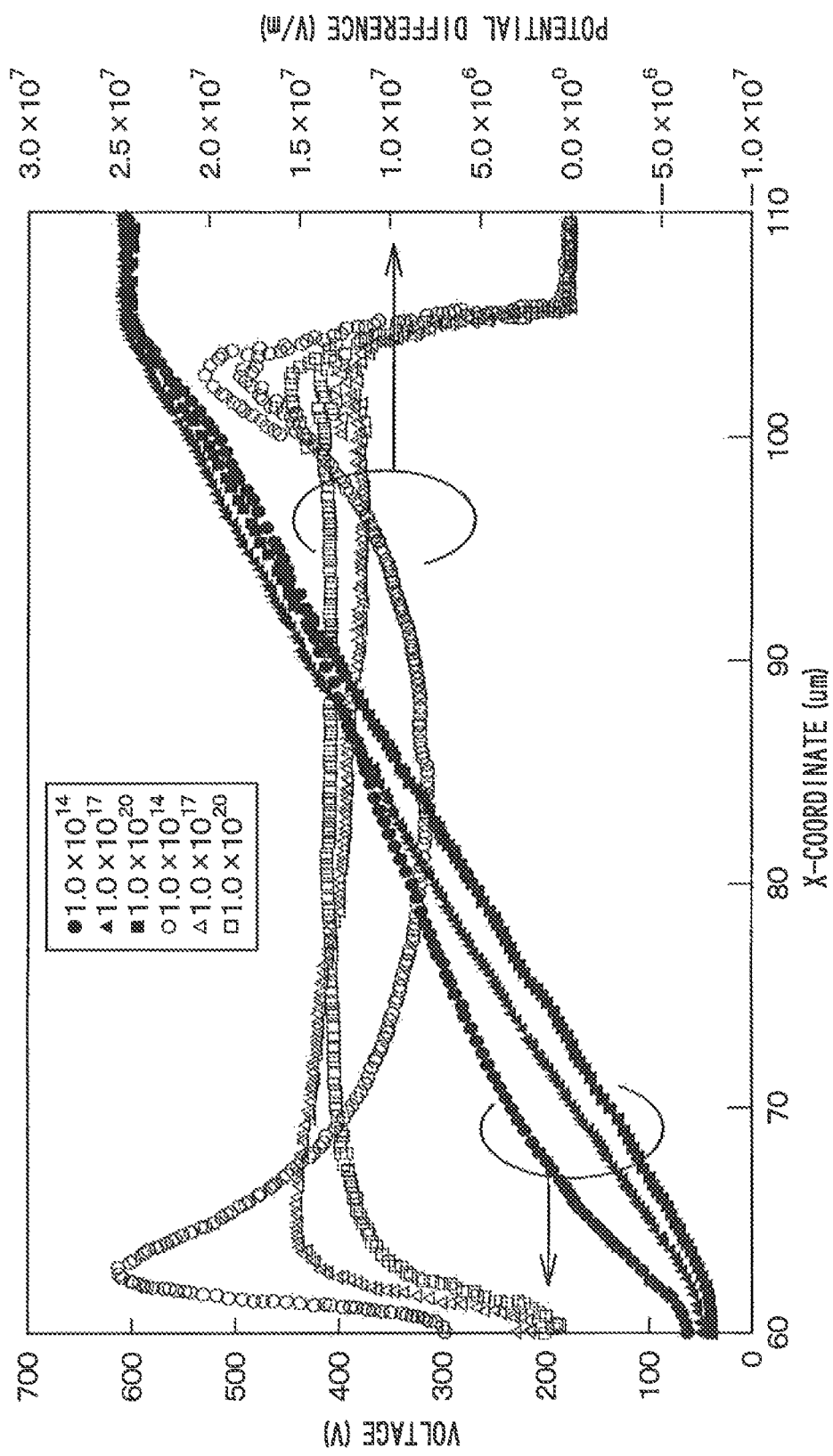
FIG. 13 is a diagram illustrating a potential and potential difference in a drift layer directly below a LOCOS layer.

FIG. 13 shows the evaluated potential and potential difference in the drift layer 22. In FIG. 13, the horizontal axis represents an X-coordinate which is defined as a distance from the emitter in a direction toward the collector. As shown in FIG. 13, the potential varies depending on the set impurity concentration. As the set impurity concentration is lower, the potential difference on the emitter side is larger. A reason for this is that the resistance of the second end portion of the SRFP 34 is increased due to the depletion. As a result, the voltage drop in the second end portion is increased so that the potential difference in the second end portion is increased.

Figure 14:
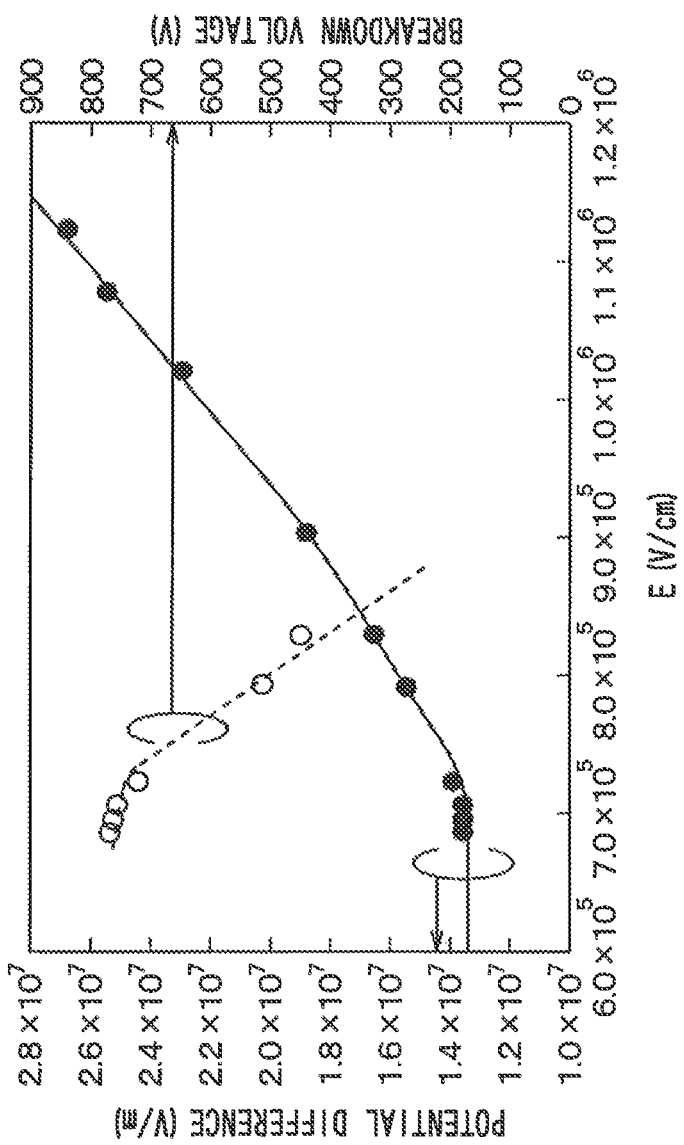
FIG. 14 is a diagram illustrating a relationship between an electric field intensity in the drift layer, the potential in the drift layer, and the breakdown voltage of the lateral IGBT.

FIG. 14 is a graph showing a relationship between the electric field in the drift layer 22 directly below the LOCOS layer 23, on which the second end portion of the SRFP 34 is located, the potential difference, and the voltage breakdown. FIG. 14 is created from the results shown in FIG. 11 and FIG. 13. As shown in FIG. 14, when the electric field is equal to or greater than $7.0\times10^{-5}$/cm, the potential difference is locally increased so that the breakdown voltage can be reduced.

The electric field of $7.0\times10^{-5}$ V/cm corresponds to the impurity concentration of $1\times10^{18}$ cm$^{-3}$. That is, when the impurity concentration of the SRFP 34 is less than $1\times10^{18}$ cm$^{-3}$, the potential difference is increased so that the breakdown voltage can be reduced. Thus, the present inventors concluded that when the impurity concentration of the SRFP 34 is equal to or greater than $1\times10^{18}$ cm$^{-3}$, a stable high breakdown voltage can be achieved. It is noted that in FIG. 14, the breakdown voltage is actual data, but the potential difference is simulation data.

As described above, according to the first embodiment, the impurity concentration of the second end portion of the SRFP 34 is set to $1\times10^{18}$ cm$^{-3}$ or more. The potential of the SRFP 34 is lowest at the second end portion. Thus, the reduction in the impurity concentration (i.e., hole concentration) due to the depletion of the SRFP 34 is reduced so that the variation in the breakdown voltage of the IGBT 8 can be reduced. The same advantage can be obtained by setting the impurity concentration of the SRFP 34 in the same manner as the impurity concentration of the SRFP 21 of the lateral FWD 7.

Second Embodiment

The second embodiment of the present disclosure is described below. A difference between the first embodiment and the second embodiment is as follows.

In the first embodiment, the impurity concentrations of the SRFP 21 and the SRFP 34 are set so that variations in the breakdown voltages of the lateral FWD 7 and the lateral IGBT 8 can be reduced. In the second embodiment, resistances of the SRFP 21 and the SRFP 34 are set so that variations in the breakdown voltages of the lateral FWD 7 and the lateral IGBT 8 can be reduced.

Since the resistance of the SRFP 34 of the lateral IGBT 8 is set basically in the same manner as the resistance of the SRFP 21 of the lateral FWD 7, the following description relates to the resistance of the SRFP 21.

Figure 15:
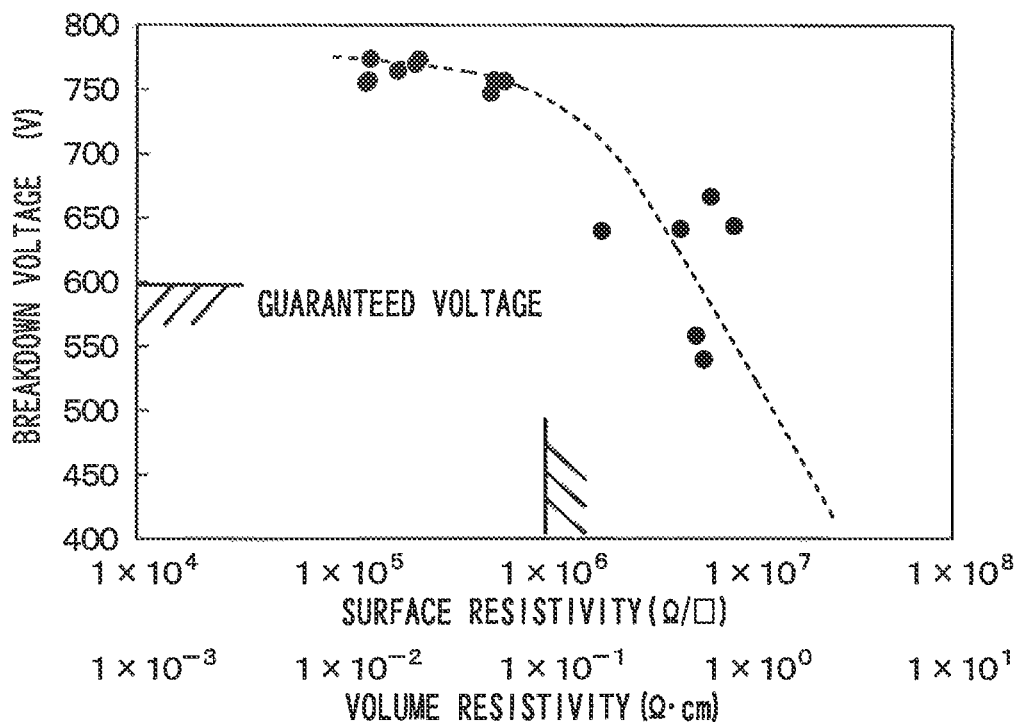
FIG. 15 is a diagram illustrating a relationship between a resistance of a SRFP of a lateral FWD and a breakdown voltage of the lateral FWD of a semiconductor device according to a second embodiment of the present disclosure.

The present inventors conducted an experiment to evaluate a relationship between the resistance of the SRFP 21 and the breakdown voltage of the lateral FWD 7 shown in FIGS. 2 and 3. FIG. 15 shows the evaluated relationship between the resistance of the SRFP 21 and the breakdown voltage of the lateral FWD 7. In FIG. 15, the resistance is expressed as surface resistivity ($\Omega/\square$, i.e., $\Omega$/sq) or volume resistivity ($\Omega\cdot$cm).

As shown in FIG. 15, the breakdown voltage varies depending on the resistance of the SRFP 21. Further, the breakdown voltage variation varies depending on the resistance of the SRFP 21. For example, when the dose of the impurity added to the SRFP 21 is adjusted so that the surface resistivity of the SRFP 21 can range from $1\times10^5\Omega/\square$ to $1\times10^6\Omega/\square$ (i.e., so that the volume resistivity of the SRFP 21 can range from $1\times10^{-2}\Omega\cdot$cm to $1\times10^{-1}\Omega\cdot$cm), a stable high breakdown voltage of 700V or more (specifically, about 750V) can be obtained. In contrast, when the dose of the impurity added to the SRFP 21 is adjusted so that the surface resistivity of the SRFP 21 can be $1\times10^6\Omega/\square$ or more, an unstable low breakdown voltage can be obtained.

For example, when the surface resistivity of the SRFP 21 is set to $1\times10^6\Omega/\square$ or less, the lateral FED 7 can have a stable guaranteed operating voltage of 600V or more. For this reason, according to the second embodiment, the surface resistivity of the SRFP 21 is set to $1\times10^6\Omega/\square$ or less.

Figure 16:
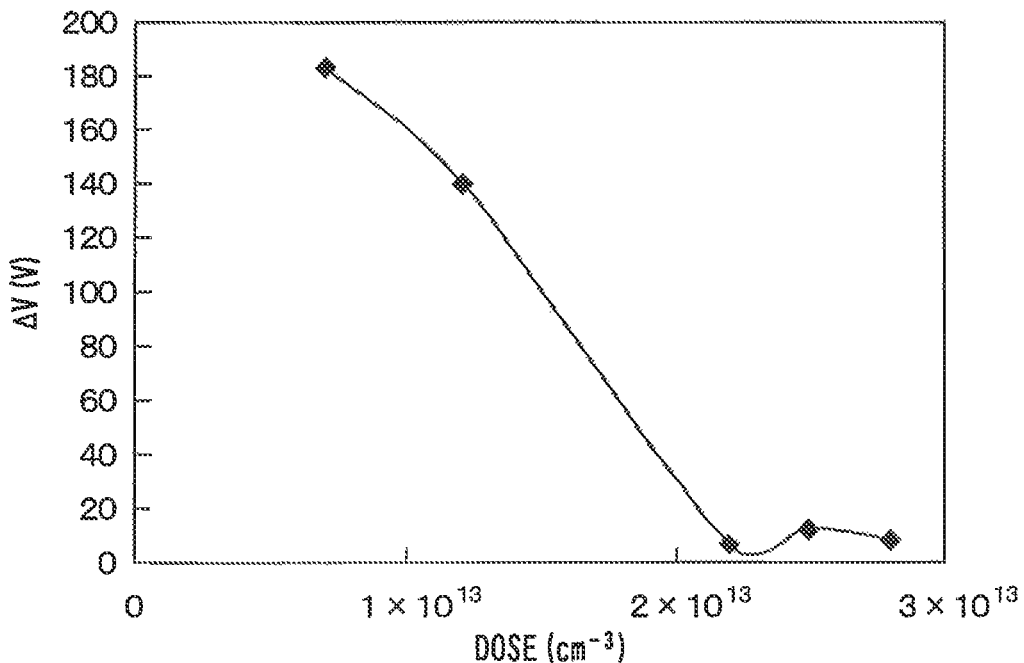
FIG. 16 is a diagram illustrating a relationship between a dose of an impurity added to the SRFP of the lateral FWD and a variation in the breakdown voltage of the lateral FWD.

Further, the present inventors evaluated a relationship between the dose of the impurity added to the SRFP 21 and the variation in the breakdown voltage of the lateral FWD 7. FIG. 16 shows the evaluated relationship between the dose of the impurity and the variation in the breakdown voltage. In FIG. 16, $\Delta V$ represents the variation in the breakdown voltage.

As shown in FIG. 16, when the dose of the impurity added to the SRFP 21 is set to $1\times10^{13}$ cm$^{-3}$ or less, the breakdown variation $\Delta V$ becomes 180V, which is a large value. In contrast, when the dose of the impurity added to the SRFP 21 is set to $2\times10^{13}$ cm$^{-3}$ or more, the breakdown variation $\Delta V$ becomes 20V, which is a small value. A reason for this is that the resistance of the SRFP 21 changes depending on impurity activation ratio. As the dose of the impurity added to the SRFP 21 is larger, the variation of the resistance of the SRFP 21 becomes smaller so that the breakdown voltage variation ΔV can become smaller. Thus, according to the embodiment, to reduce the breakdown voltage variation ΔV, the dose of the impurity is set to a large value so that the surface resistivity of the SRFP 21 can be set to $1 \times 10^6 \Omega/\square$ or less.

Figure 17:
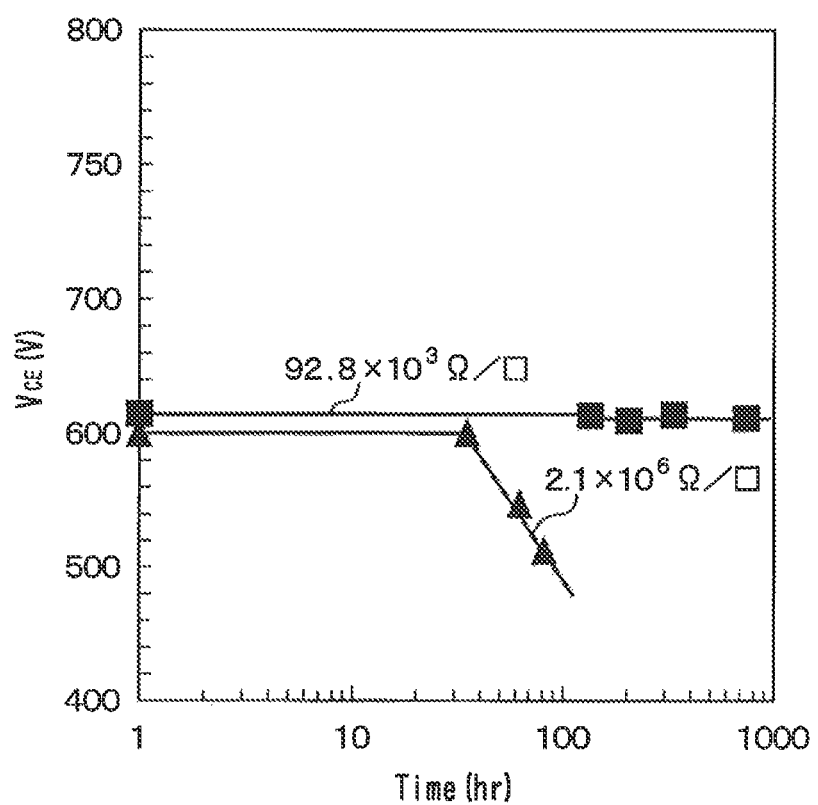
FIG. 17 is a diagram illustrating a relationship between the resistance of the SRFP of the lateral FWD and a reduction in the breakdown voltage of the lateral FWD.

Further, the present inventors conducted a high-temperature blocking test to evaluate the resistance of the SRFP 21 and a reduction in the breakdown voltage of the lateral FWD 7. FIG. 17 shows the result of the test. In the test, the lateral FWD 7 and the lateral IGBT 8 are connected in parallel to each other as shown in FIG. 1, and a change in a collector-emitter voltage $V_{CE}$ with respect to an energization time Time is measured under conditions that the surface resistivity of the SRFP 21 is set to $2.1 \times 10^6 \Omega/\square$ and $92.8 \times 10^3 \Omega/\square$, a temperature is set to 175° C., and a voltage of 600V is applied between the anode and the cathode so that an electric current of 1 μA can flow between the anode and the cathode. Further, in the test, a separation distance of adjacent turns of the scroll-shaped SRFP 21 is set to 1.2 μm, the thickness of the BOX layer 11b is set to 5 μm, and the thickness of the active layer 11c is set to 15 μm.

As shown in FIG. 16, when the surface resistivity of the SRFP 21 is set to $92.8 \times 10^3 \Omega/\square$, which is less than $1 \times 10^6 \Omega/\square$, the breakdown voltage is maintained unchanged during the test. In contrast, when the surface resistivity of the SRFP 21 is set to $2.1 \times 10^6 \Omega/\square$, which is larger than $1 \times 10^6 \Omega/\square$, the breakdown voltage is reduced during the test. Thus, when the surface resistivity of the SRFP 21 is set to $1 \times 10^6 \Omega/\square$ or less, the breakdown voltage of the lateral FWD 7 can be maintained under high temperature conditions.

As described above, according to the second embodiments, the surface resistivity of each of the SRFP 21 and the SRFP 34 is set to $1 \times 10^6 \Omega/\square$ or less. In such an approach, the variations in the breakdown voltages of the lateral FWD 7 and the lateral IGBT 8 can be reduced.

Third Embodiment

A third embodiment of the present disclosure is described below. A difference of the third embodiment from the first and second embodiments is as follows.

Figure 18:
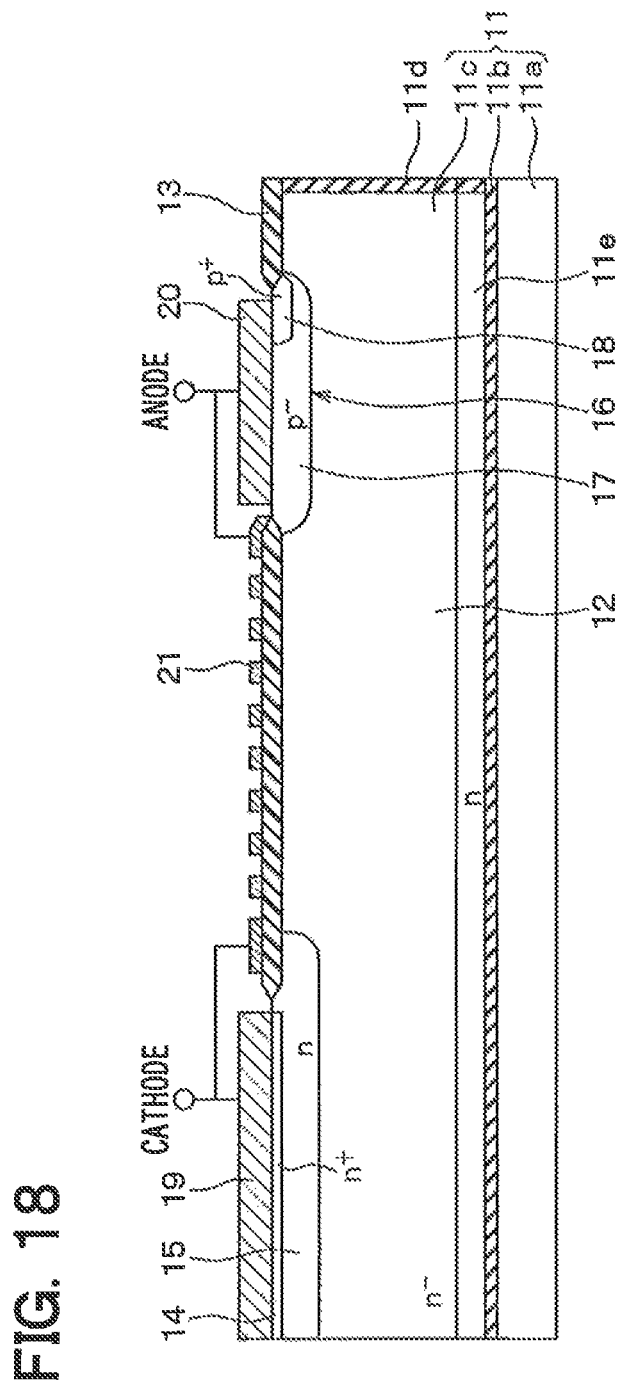
FIG. 18 is a diagram illustrating a cross-sectional view of one cell of a lateral FWD of a semiconductor device according to a third embodiment of the present disclosure.

FIG. 18 is a cross-sectional view of a lateral FWD 7 of a semiconductor device according to the third embodiment. FIG. 18 corresponds to FIG. 3 and is taken along the line in FIG. 2.

As shown in FIG. 18, the active later 11c has an n-type interface layer 11e at an interface with the BOX later 11b. The interface layer 11e has the same conductivity type as the active later 11c. An impurity concentration of the interface layer 11e is higher than the impurity concentration of the active layer 11c. Like the first and second embodiments, the impurity concentration of the SRFP 21 is set to $1.0 \times 10^{18}$ cm$^{-3}$ or more, or the surface resistivity of the SRFP 21 is set to $1 \times 10^6 \Omega/\square$ or less.

The present inventors found out that when the active later 11c has the interface layer 11e, the electric field reduction effect can be improved by reducing the separation distance between adjacent turns of the scroll-shaped SRFP 21. Accordingly, the breakdown voltage of the lateral FWD 7 can be improved.

Figure 19A:
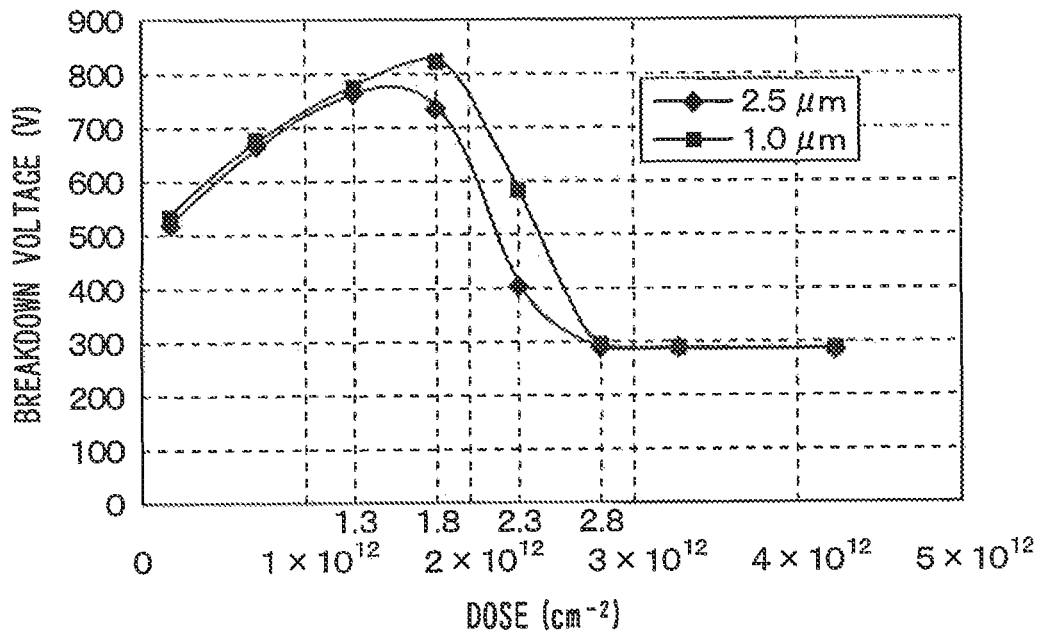
FIG. 19A is a diagram illustrating a relationship between a dose of an impurity added to a SRFP of the lateral FWD of FIG. 18 and a breakdown voltage of the lateral FWD of FIG. 18.
Figure 19B:
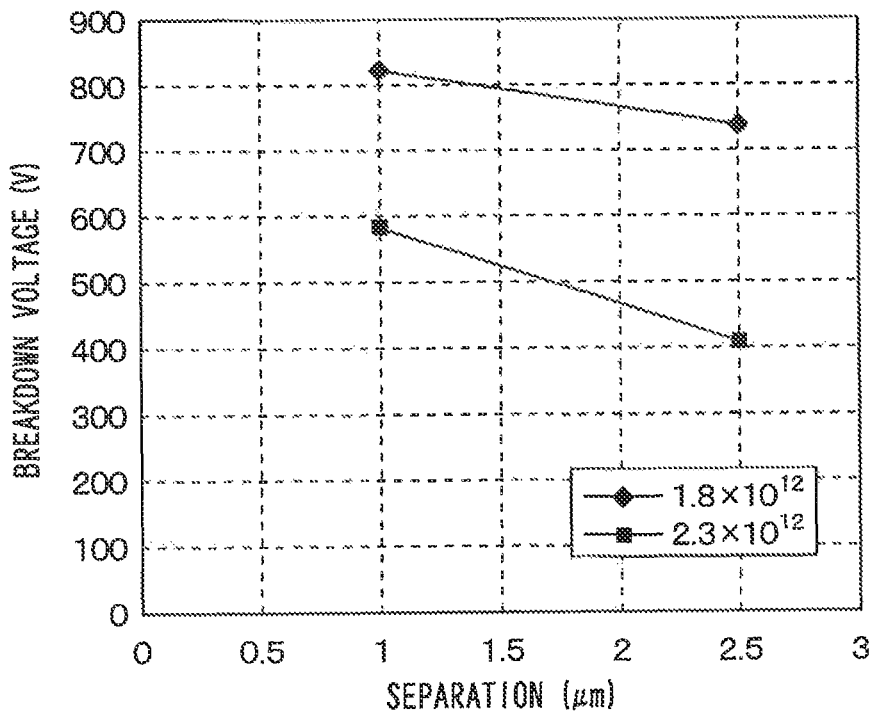
FIG. 19B is a diagram created from FIG. 19A and illustrating a relationship between a separation distance of adjacent turns of the SRFP of the lateral FWD of FIG. 18 and the breakdown voltage of the lateral FWD of FIG. 18.

FIG. 19A shows a result of an experiment conducted by the present inventors to evaluate a relationship between a dose of an impurity added to the interface layer 11e and the breakdown voltage of the lateral FWD 7 by setting the separation distance between adjacent turns of the SRFP 21 to 2.5 μm and 1.0 μm. FIG. 19B is a diagram created from FIG. 19A and shows a relationship between the separation distance and the breakdown voltage when the impurity dose is set to $1.8 \times 10^{12}$ cm$^{-2}$ and $2.3 \times 10^{12}$ cm$^{-2}$. In this experiment, the thickness of the BOX layer 11B is set to 5 μm.

As shown in FIG. 19A, the breakdown voltage increases with an increase in the dose of the impurity added to the interface layer 11e. However, after the impurity dose exceeds a certain value, the breakdown voltage starts to decrease. As shown in FIG. 19B, as the separation distance is smaller, the breakdown voltage is higher. Specifically, within a range of the impurity dose from $1.3 \times 10^{12}$ cm$^{-2}$ to $2.8 \times 10^{12}$ cm$^{-2}$, the breakdown voltage is higher when the separation distance is set to 1.0 μm than when the separation distance is set to 2.5 μm.

As described above, according to the third embodiment, the active later 11c of the lateral FWD 7 has the interface layer 11e at the interface with the BOX later 11b, and the separation distance of adjacent turns of the SRFP 21 is reduced. In such an approach, the electric field concentration effect is improved so that the breakdown voltage of the lateral FWD 7 can be improved. Likewise, the active later 11c of the lateral IGBT 8 can have the interface layer 11e at the interface with the BOX later 11b, and the separation distance of adjacent turns of the SRFP 34 can be reduced. In such an approach, the electric field concentration effect is improved so that the breakdown voltage of the lateral IGBT 8 can be improved.

Fourth Embodiment

A fourth embodiment of the present disclosure is described below with reference to FIG. 20 and FIGS. 21A and 21B. In the fourth embodiment, a wiring structure for the semiconductor device of the first, second, and third embodiments is described.

Figure 20:
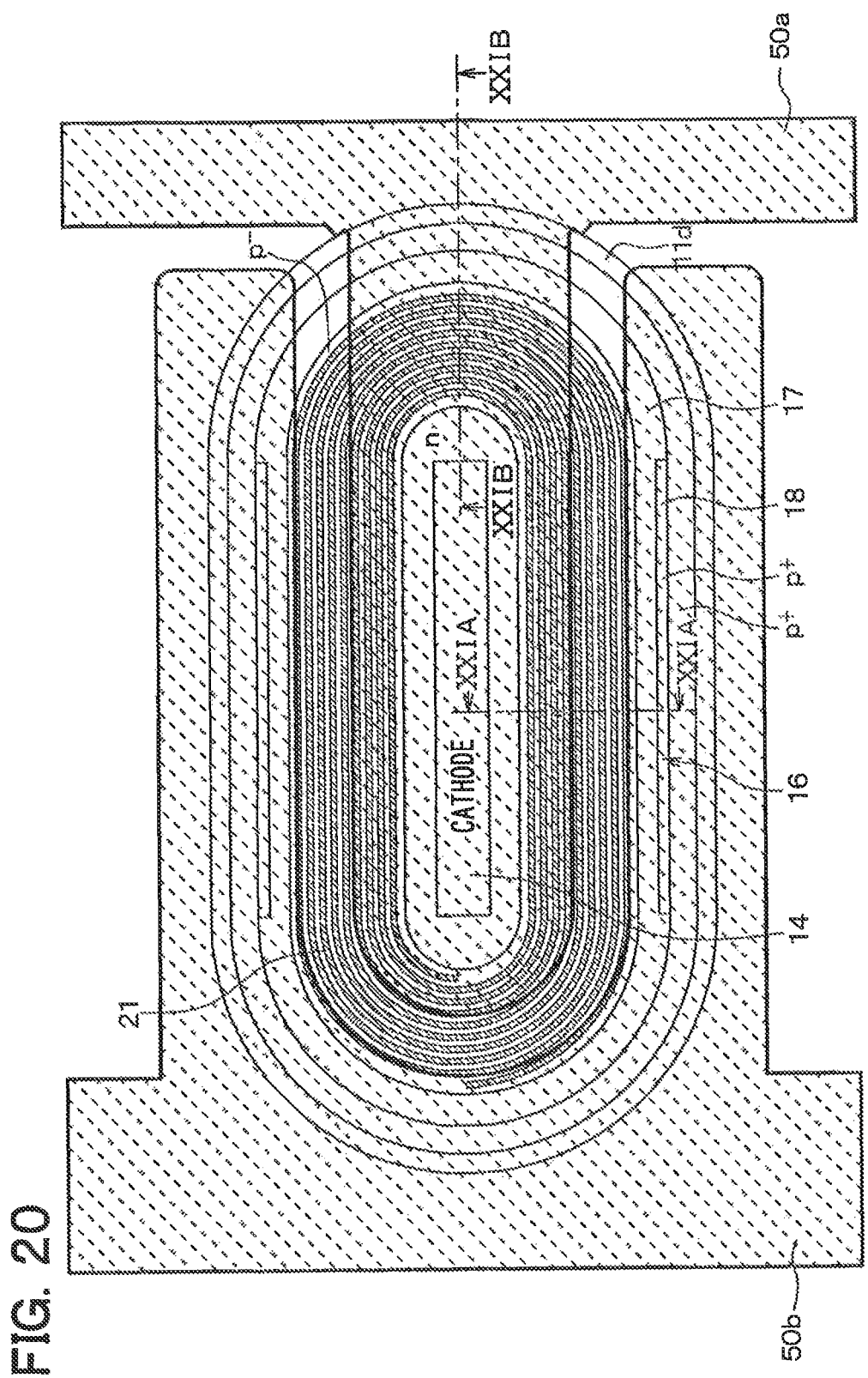
FIG. 20 is a diagram illustrating a top layout view of a lateral FWD of a semiconductor device according to a fourth embodiment of the present disclosure.

FIG. 20 is a diagram illustrating a top layout view of one cell of a lateral FWD 7 of a semiconductor device of the fourth embodiment. FIG. 21A is diagram illustrating a cross-sectional view taken along the line XXIA-XXIA in FIG. 20. FIG. 21B is diagram illustrating a cross-sectional view taken along the line XXIB-XXIB in FIG. 20. The semiconductor device of the fourth embodiment has almost the same structure as the semiconductor device of the first embodiment. For the sake of simplicity, the high impurity concentration portion 18 and the like are omitted in FIGS. 21A and 21B.

As shown in FIG. 20, a wiring structure is formed on the surface of the SOI substrate 11 and connected to each portion of the lateral FWD 7. The wiring structure is described in detail below.

Figure 21A:
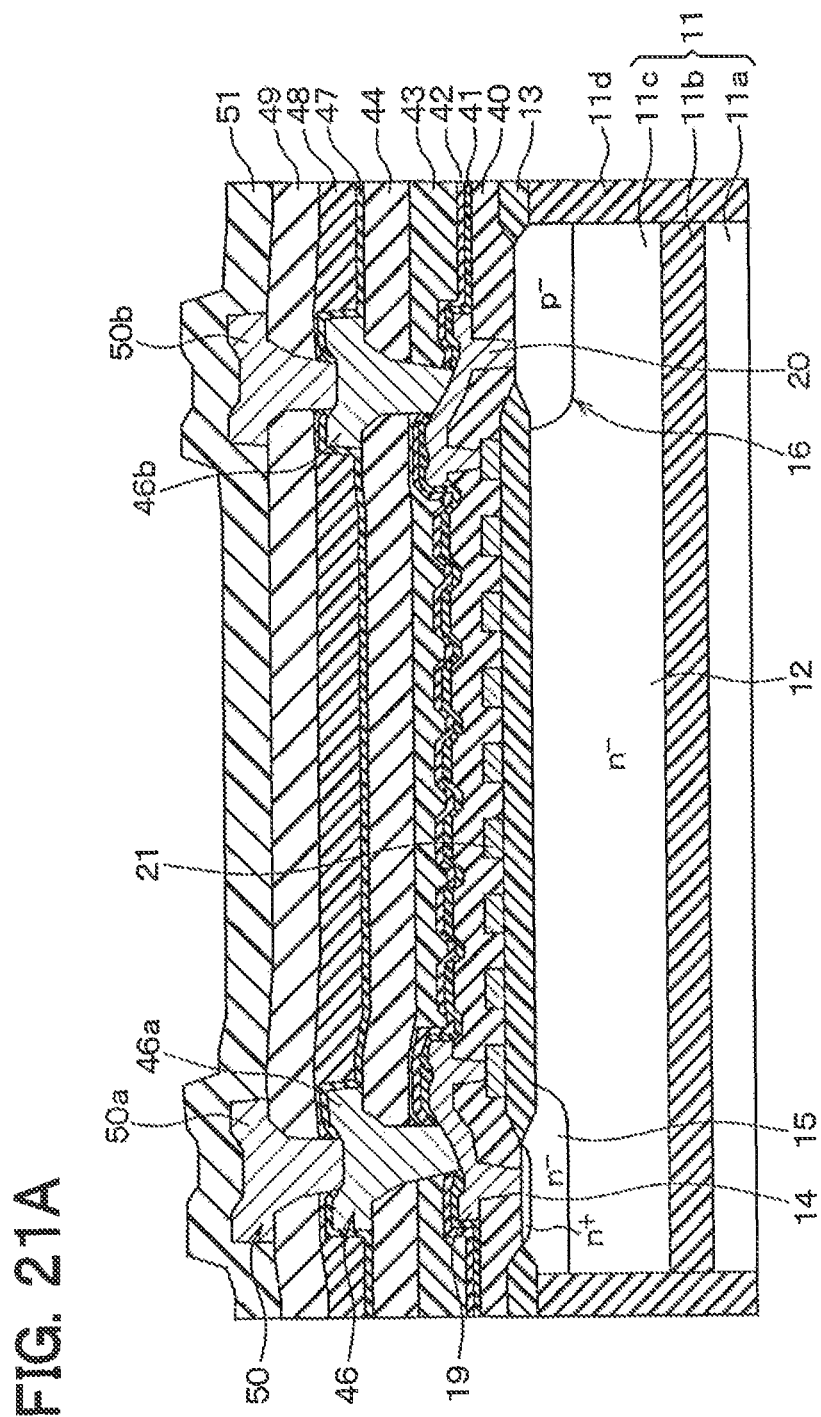
FIG. 21A is a diagram illustrating a cross-sectional view taken along the line XXIA-XXIA in FIG. 20.
Figure 21B:
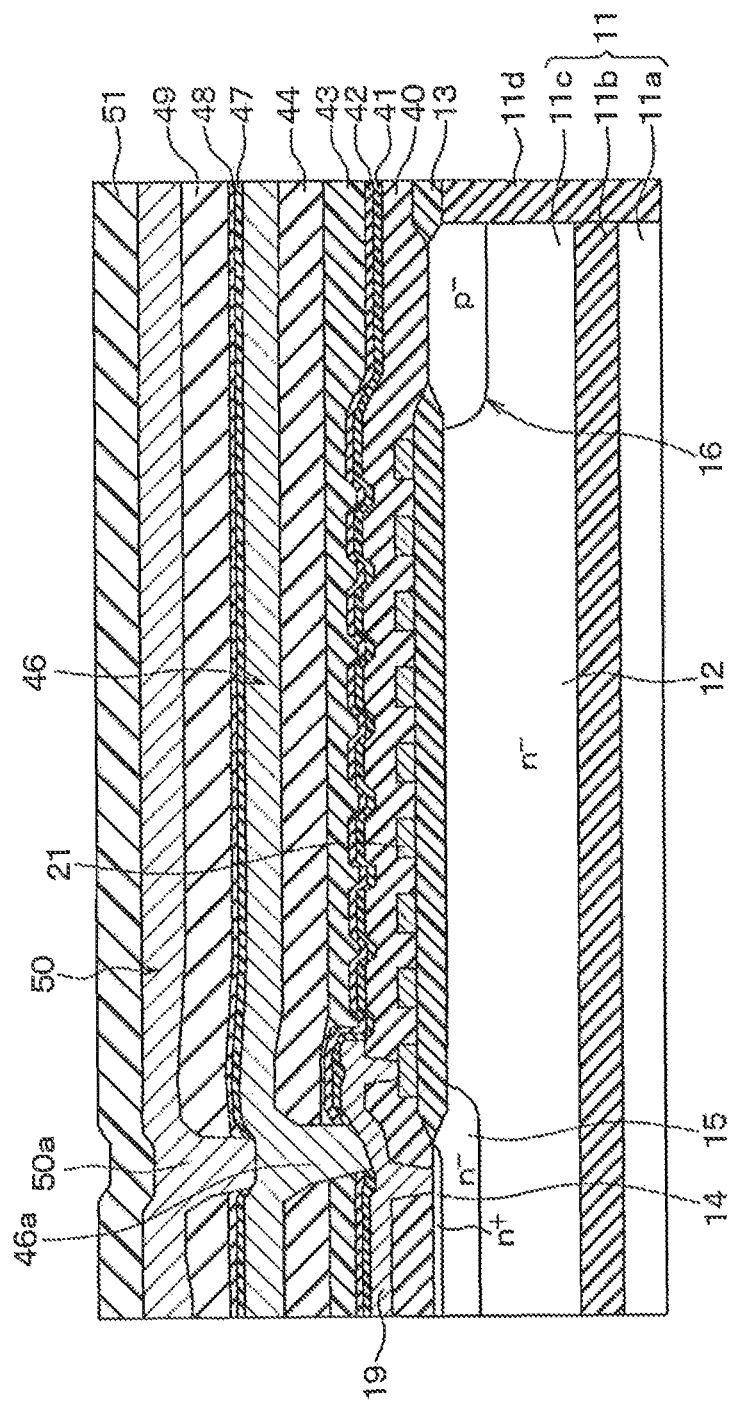
FIG. 21B is a diagram illustrating a cross-sectional view taken along the line XXIB-XXIB in FIG. 20.

As shown in FIGS. 21A and 21B, a Borophosphosilicate glass (BPSG) layer 40, as a first interlayer dielectric layer, is formed over the surface of the SOI substrate 11 so that the SRFP 21 can be covered with the BPSG layer 40. The BPSG layer 40 has contact holes. The cathode contact region 14, the anode region 16, and both ends of the SRFP 21 are exposed outside the BPSG layer 40 through the contact holes. The cathode electrode 19 and the anode electrode 20 are formed on the BPSG layer 40. For example, the cathode electrode 19 and the anode electrode 20 can be made of aluminum. The cathode electrode 19 is connected through the contact holes to the cathode contact region 14 and one end of the SRFP 21. The anode electrode 20 is connected through the contact holes to the anode region 16 and the other end of the SRFP 21.

A silicon nitride layer 41 is formed on the cathode electrode 19, the anode electrode 20, and the BPSG layer 40. An interlayer dielectric layer 42 is formed on the silicon nitride layer 41. A first spin-on-glass (SOG) layer 43 is formed on the interlayer dielectric layer 42. An interlayer dielectric layer 44 is formed on the first SOG layer 43. The silicon nitride layer 41 protects the lateral FWD 7 from water. The first SOG layer 43 and the interlayer dielectric layers 42 and 44 serve as a second interlayer dielectric layer. Further, the first SOG layer 43 serves to improve flatness due to its high fluidity.

The layers 41-44 have contact holes. The cathode electrode 19 and the anode electrode 20 are exposed outside the layer 41-44 through the contact holes. A first aluminum wiring layer 46 is formed on the interlayer dielectric layer 44. The first aluminum wiring layer 46 includes a first wire 46a and a second wire 46b. The first wire 46a is electrically connected through the contact holes to the cathode electrode 19. The second wire 46b is electrically connected through the contact holes to the anode electrode 20.

An interlayer dielectric layer 47 is formed on the first aluminum wiring layer 46 and the interlayer dielectric layer 44. A second spin-on-glass (SOG) layer 48 is formed on the interlayer dielectric layer 47. An interlayer dielectric layer 49 is formed on the second SOG layer 48. The second SOG layer 48 and the interlayer dielectric layers 47 and 49 serve as a third interlayer dielectric layer. Further, the second SOG layer 48 serves to improve flatness due to its high fluidity. The layers 47-49 have contact holes. The first and second wires 46a and 46b are exposed outside the layer 47-49 through the contact holes. A second aluminum wiring layer 50 is formed on the interlayer dielectric layer 49. The second aluminum wiring layer 50 includes a first wire 50a and a second wire 50b. The first wire 50a is electrically connected through the contact holes to the first wire 46a, which is connected to the cathode electrode 19. The second wire 50b is electrically connected through the contact holes to the second wire 46b, which is connected to the anode electrode 20.

The first and second aluminum wiring layers 46, 50 extend along the longitudinal directions of the cathode contact region 14 and the anode region 16, respectively. The first wires 46a, 50a of the first and second aluminum wiring layers 46, 50a, which are connected to the anode region 16, extend in a first direction. The second wires 46b, 50b of the first and second aluminum wiring layers 46, 50a, which are connected to the cathode contact region 14, extend in a second direction opposite to the first direction. That is, as shown in FIG. 21B, the first and second aluminum wiring layers 46, 50, which are connected to the cathode contact region 14, are located above each layer and the SRFP 21 of the lateral FWD 7. A high voltage is applied to the first and second aluminum wiring layers 46, 50.

A protection layer 51 such as a plasma silicon nitride (P-SiN) is formed on the second aluminum layer 50 so that the surface of the semiconductor device can be covered with the protection layer 51. In this way, the wiring structure for the lateral FWD 7 is formed.

In the wiring structure, water is contained in the interlayer dielectric layer such as the SOG layer. If H-ion and O-ion in water in the interlayer dielectric layer enter the lateral FWD 7, characteristics of the lateral FWD 7 may be degraded. Since a high voltage is applied to the first and second aluminum wiring layers 46, 50, H-ion and O-ion having positive charges are likely to move in a direction away from the first and second aluminum wiring layers 46, 50. That is, H-ion and O-ion are likely to move in a direction toward the lateral FWD 7. Such a movement of water can be understood from FIG. 17, which shows the collector-emitter voltage $V_{CE}$ decreases with time.

According to the fourth embodiment, the silicon nitride layer 41 is located below the interlayer dielectric layer containing water and protects the lateral FWD 7 from water. Thus, the characteristics of the lateral FWD 7 can be maintained.

The wiring structure discussed in the fourth embodiment can be used for not only the lateral FWD 7 but also the lateral IGBT 8.

Fifth Embodiment

A fifth embodiment of the present disclosure is described below with reference to FIG. 22. In the fifth embodiment, like in the fourth embodiment, a wiring structure for the semiconductor device of the first, second, and third embodiments is described. A difference between the fifth embodiment and the fourth embodiment is as follows.

Figure 22:
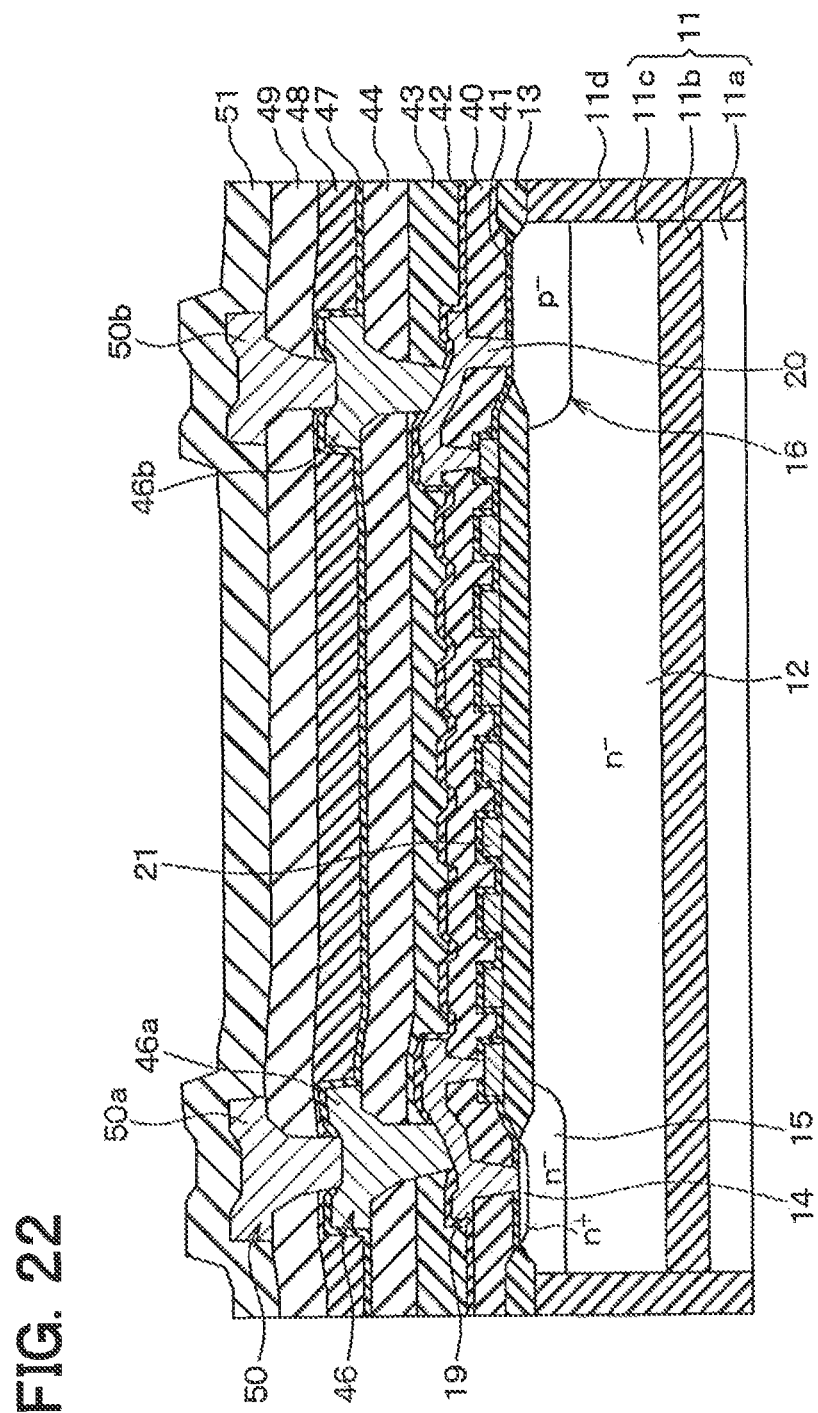
FIG. 22 is a diagram illustrating a cross-sectional view of one cell of a lateral FWD of a semiconductor device according to a fifth embodiment of the present disclosure.

FIG. 22 is a diagram illustrating a cross-sectional view of one cell of a lateral FWD 7 of a semiconductor device of the fifth embodiment. As shown in FIG. 22, according to the fifth embodiment, the silicon nitride layer 41 is located below the BPSG layer 40. That is, the silicon nitride layer 41 is located between the lateral FWD 7 and the BPSG layer 40. In such an approach, the silicon nitride layer 41 protects the lateral FWD 7 from water contained in the BPSG layer 40. Thus, the characteristics of the lateral FWD 7 can be maintained.

Sixth Embodiment

A sixth embodiment of the present disclosure is described below with reference to FIG. 21A difference between the first embodiment and the sixth embodiment is as follows.

Figure 23:
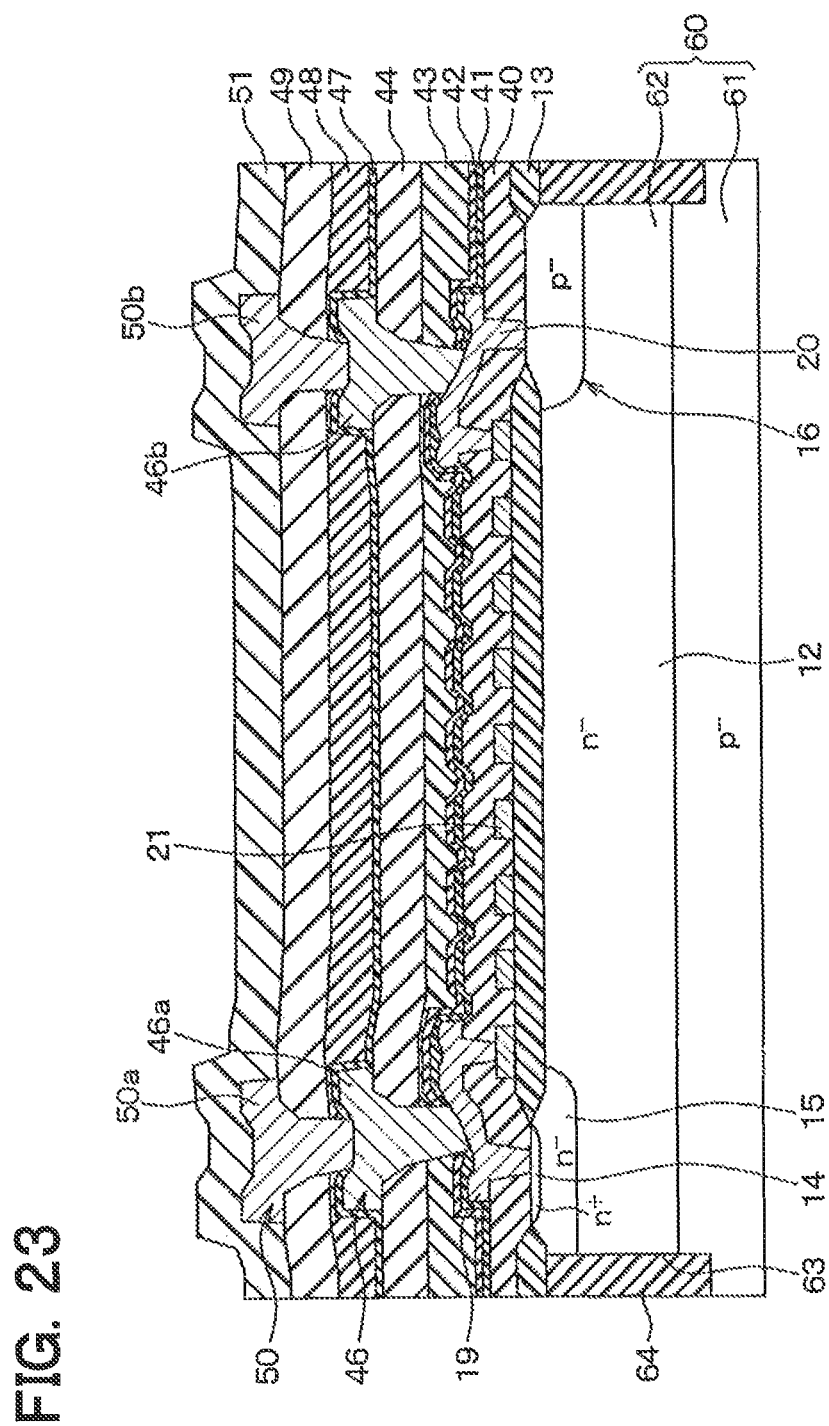
FIG. 23 is a diagram illustrating a cross-sectional view of one cell of a lateral FWD of a semiconductor device according to a sixth embodiment of the present disclosure.

In the sixth embodiment, a semiconductor substrate 60 is used instead of the SOI substrate 11. FIG. 23 is a diagram illustrating a cross-sectional view of one cell of a lateral FWD 7 of a semiconductor device of the sixth embodiment. As shown in FIG. 23, the semiconductor substrate 60 includes a p⁻-type silicon substrate 61 and an n⁻-type layer 62 formed on the silicon substrate 61. The layer 62 serves as the drift layer 12. A trench 63 extends from a surface of the drift layer 12 to the silicon substrate 61 through the drift layer 12. For example, the trench 63 can have the width of 0.67±0.07 µm. The trench 63 is filled with a BPSG layer so that a trench isolation structure 64 can be formed. The lateral FWD 7 is surrounded with the trench isolation structure 64 and isolated from other elements by the trench isolation structure 64.

In this way, a typical silicon substrate such as the silicon substrate 61 can be used as a semiconductor substrate instead of the SOI substrate 11.

Seventh Embodiment

Figure 24:
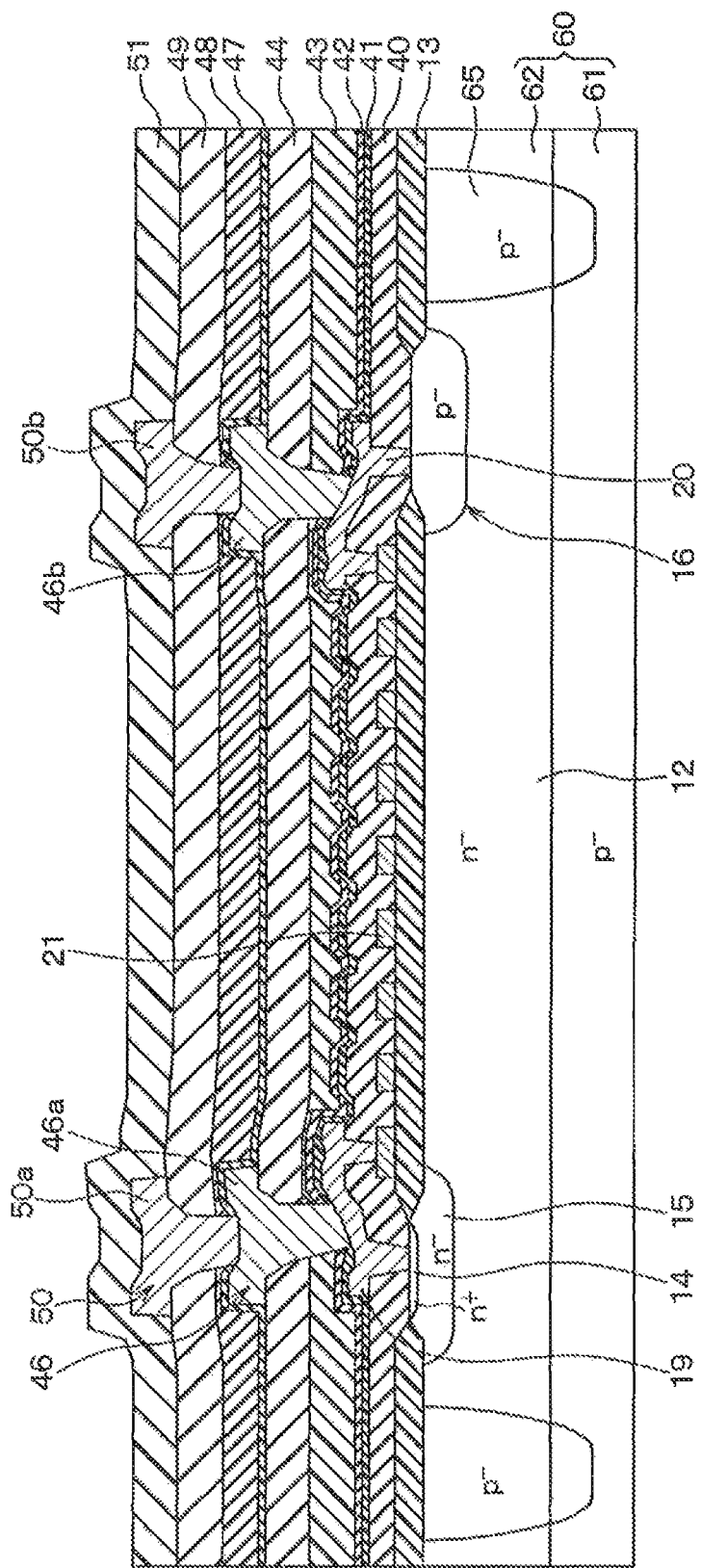
FIG. 24 is a diagram illustrating a cross-sectional view of one cell of a lateral FWD of a semiconductor device according to a seventh embodiment of the present disclosure.

A seventh embodiment of the present disclosure is described below with reference to FIG. 24. A difference between the sixth embodiment and the seventh embodiment is as follows.

In the seventh embodiment, like in the sixth embodiment, the semiconductor substrate 60 is used instead of the SOT substrate 11. FIG. 24 is a diagram illustrating a cross-sectional view of one cell of a lateral FWD 7 of a semiconductor device of the seventh embodiment. As shown in FIG. 24, the semiconductor substrate 60 includes the p⁻-type silicon substrate 61 and the n⁻-type layer 62 formed on the silicon substrate 61. The layer 62 serves as the drift layer 12. A p⁻-type isolation region 65 extends from a surface of the drift layer 12 to the silicon substrate 61 through the drift layer 12.

The lateral FWD 7 is surrounded with the isolation region 65 and isolated from other elements by a pn-junction between the isolation region 65 and the drift layer 22.

In this way, a pn-junction isolation structure formed by the isolation region 65 and the drift layer 22 can be used instead of the trench isolation structure 64.

Seventh Embodiment

A seventh embodiment of the present disclosure is described below with reference to FIG. 24. A difference between the sixth embodiment and the seventh embodiment is as follows.

In the seventh embodiment, like in the sixth embodiment, the semiconductor substrate 60 is used instead of the SOI substrate 11. FIG. 24 is a diagram illustrating a cross-sectional view of one cell of a lateral FWD 7 of a semiconductor device of the seventh embodiment. As shown in FIG. 24, the semiconductor substrate 60 includes the p⁻-type silicon substrate 61 and the n⁻-type layer 62 formed on the silicon substrate 61. The layer 62 serves as the drift layer 12, A p⁻-type isolation region 65 extends from a surface of the drift layer 12 to the silicon substrate 61 through the drift layer 12. The lateral FWD 7 is surrounded with the isolation region 65 and isolated from other elements by a pn-junction between the isolation region 65 and the drift layer 22.

In this way, a pn-junction isolation structure formed by the isolation region 65 and the drift layer 22 can be used instead of the trench isolation structure 64.

(Modifications)

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

Figure 25:
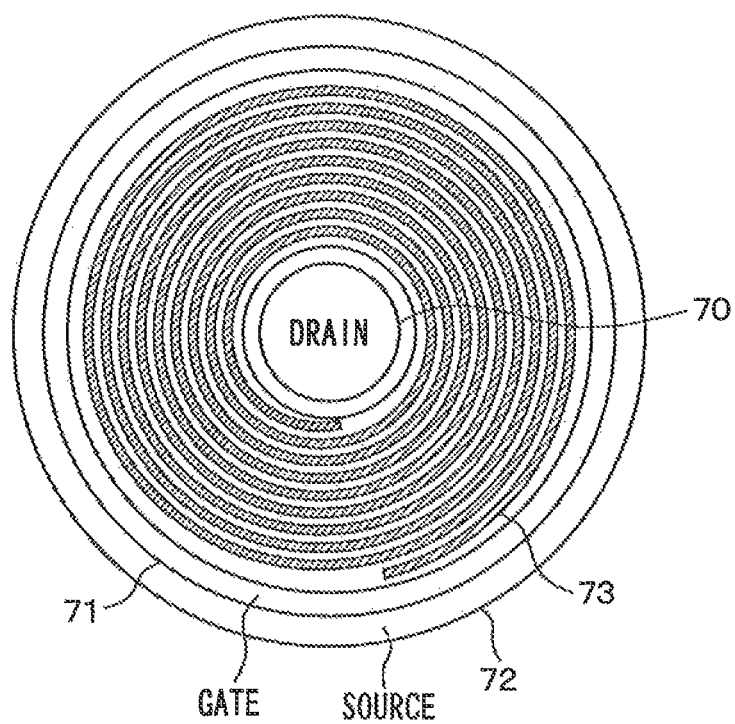
FIG. 25 is a diagram illustrating a top layout view of a lateral LDMOS of a semiconductor device according a modification of the embodiments.

For example, in the embodiments, the semiconductor device has both the lateral FWD 7 and the lateral IGBT 8. Alternatively, the semiconductor device can have either the lateral FWD 7 or the lateral IGBT 8. The lateral element is not limited to the lateral FWD 7 and the lateral IGBT 8. For example, as shown in FIG. 25, the lateral element can be a lateral LDMOS, FIG. 25 is a top layout view of the lateral LDMOS. In the lateral LDMOS, a gate electrode 91 and a source region 72 are concentrically arranged with respect to a drain region 70. A SRFP 73 is wound in a scroll (i.e., spiral) shape around the drain region 70. The structures as described in the embodiments can be applied to the LDMOS.

In the embodiments, the resistive field plates 21 and 34 are scroll-shaped. The resistive field plates 21 and 34 are not limited to a scroll shape. Even when the resistive field plate has a shape other than a scroll, the same advantages of the embodiments can be obtained by setting the impurity concentration of the second end of the resistive field plate on the lower potential electrode side (the anode in the case of the lateral FWD 7, the emitter in the case of the lateral IGBT 8) to a value equal to or greater than $1 \times 10^{18}$ cm$^{-3}$.

It is noted that the second end portion of the resistive field plate is defined as a portion facing a diffusion layer connected to the lower potential electrode. For example, when the resistive field plate has a scroll shape and is wound around a higher potential electrode, the second end portion of the resistive field plate is the outermost turn of the scroll shape. More specifically, the second end portion of the resistive field plate is a portion of the outermost turn of the scroll shape facing the diffusion layer connected to the lower potential electrode. In contrast, when the resistive field plate has a scroll shape and is wound around a lower potential electrode, the second end portion of the resistive field plate is the innermost turn of the scroll shape. More specifically, the second end portion of the resistive field plate is a portion of the innermost turn of the scroll shape facing the diffusion layer connected to the lower potential electrode.

Figure 26:
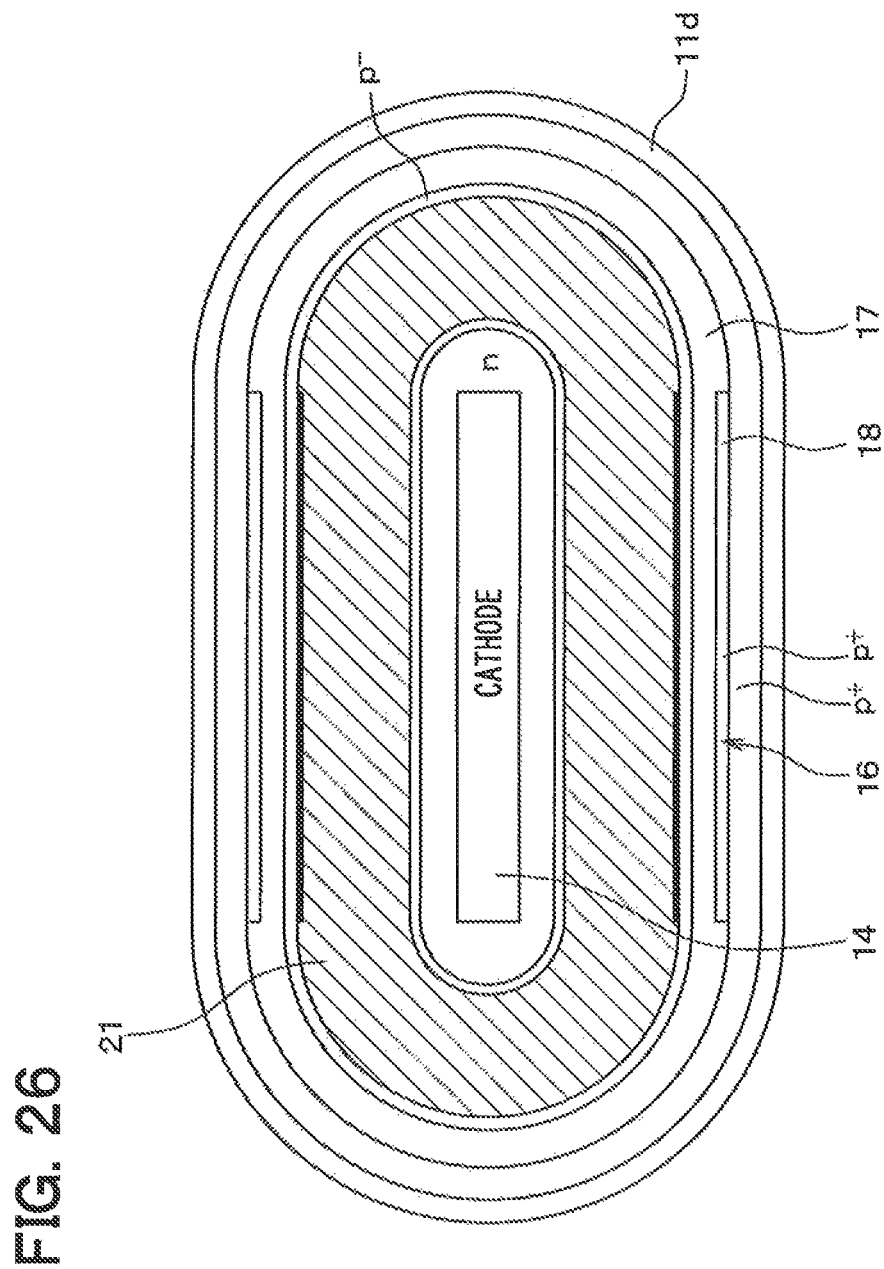
FIG. 26 is a diagram illustrating a top layout view of a lateral LDMOS of a semiconductor device according another modification of the embodiments.

In the embodiments, adjacent turns of the scroll-shaped resistive field plate are separated by a predetermined distance. Alternatively, as shown in FIG. 26, the separation distance of adjacent turns of the resistive field plate 21 can be zero so that the resistive field plate 21 can have a ring shape with a predetermined width in a direction from the cathode to the anode. As indicated by a bold line in FIG. 26, the resistive field plate 21 has a portion facing the anode region 16 connected to the anode electrode 20. In the example shown in FIG. 26, the impurity concentration of at least the facing portion of the resistive field plate 21 can be set to $1 \times 10^{18}$ cm$^{-3}$ or more. In such an approach, the same advantages as the embodiments can be obtained.

The conductivity types in the embodiments can be interchanged.

What is claimed is:

1. A semiconductor device having a lateral element, the semiconductor device comprising:
    a semiconductor substrate including a first conductivity-type semiconductor layer;
    a first electrode on a surface of the semiconductor layer;
    a second electrode on the surface of the semiconductor layer; and
    a resistive field plate wound in a scroll shape around the first electrode and extending toward the second electrode, wherein
    a resistance of the resistive field plate is equal to or less than $1 \times 10^6 \Omega$/sq.,
    wherein
    the semiconductor substrate is a SOI substrate including a supporting substrate, a buried insulating layer on the supporting substrate, and an active layer on the buried insulating layer, the active layer serving as the semiconductor layer,
    the active layer has a first conductivity-type interface layer at an interface with the buried insulating layer,
    a concentration of a second impurity in the interface layer is greater than a concentration of the second impurity in a remaining portion of the active layer,
    the second impurity is of first conductivity type,
    a separation distance between adjacent turns of the scroll shape is equal to or less than 1 μm, and
    a dose of the second impurity in the interface layer ranges from $1.3 \times 10^{12}$ cm$^{-2}$ to $2.8 \times 10^{12}$ cm$^{-2}$.

2. A semiconductor device having a lateral element, the semiconductor device comprising:
    a semiconductor substrate including a first conductivity-type semiconductor layer;
    a first electrode on a surface of the semiconductor layer;
    a second electrode on the surface of the semiconductor layer; and
    a resistive field plate wound in a scroll shape around the first electrode and extending toward the second electrode, wherein
    a resistance of the resistive field plate is equal to or less than $1 \times 10^6 \Omega$/sq., the semiconductor device further comprising:

a first interlayer dielectric layer on the semiconductor substrate, the first interlayer dielectric layer covering the resistive field plate; and a silicon nitride layer on the first interlayer dielectric layer, the silicon nitride layer covering the first electrode and the second electrode, wherein the first interlayer dielectric layer has contact holes, and the first electrode and the second electrode are electrically connected to the lateral element through the contact holes.

3. A semiconductor device having a lateral element, the semiconductor device comprising:

a semiconductor substrate including a first conductivity-type semiconductor layer;

a first electrode on a surface of the semiconductor layer;

a second electrode on the surface of the semiconductor layer; and a resistive field plate wound in a scroll shape around the first electrode and extending toward the second electrode, wherein a resistance of the resistive field plate is equal to or less than $1 \times 10^6 \Omega/\text{sq}.$, the semiconductor device further comprising:

a silicon nitride layer on the semiconductor substrate, the silicon nitride layer covering the resistive field plate; and a first interlayer dielectric layer on the silicon nitride layer, wherein each of the silicon nitride layer and the first interlayer dielectric layer has contact holes, and the first electrode and the second electrode are electrically connected to the lateral element through the contact holes.

* * * * *